(12) United States Patent
Ferrera et al.

(10) Patent No.: US 12,738,313 B2
(45) Date of Patent: Sep. 15, 2026

(54) IN-MEMORY COMPUTE SRAM WITH INTEGRATED TOGGLE/COPY OPERATION AND RECONFIGURABLE LOGIC OPERATIONS

(71) Applicant: Intel Corporation, Santa Clara, CA (US)

(72) Inventors: Steve P. Ferrera, Austin, TX (US); Mauricio J. Valverde Monge, Hillsboro, OR (US); Anik Basu, Austin, TX (US); Feroze Merchant, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 370 days.

(21) Appl. No.: 17/538,478

(22) Filed: Nov. 30, 2021

(65) Prior Publication Data

US 2023/0170012 A1 Jun. 1, 2023

(51) Int. Cl.

| | |
|---|---|
| ***G11C 7/08*** | (2006.01) |
| ***G11C 11/408*** | (2006.01) |
| ***G11C 11/4091*** | (2006.01) |
| ***G11C 11/4094*** | (2006.01) |
| ***G11C 11/4096*** | (2006.01) |
| ***H03K 19/173*** | (2006.01) |
| ***H03K 19/20*** | (2006.01) |

(52) U.S. Cl.

CPC ...... *G11C 11/4091* (2013.01); *G11C 11/4085* (2013.01); *G11C 11/4094* (2013.01); *G11C 11/4096* (2013.01); *H03K 19/1737* (2013.01); *H03K 19/20* (2013.01)

(58) Field of Classification Search

CPC ........... G11C 11/4091; G11C 11/4085; G11C 11/4094; G11C 11/4096; G11C 7/08; G11C 7/1006; G11C 7/1096; G11C 7/227; G11C 11/412; G11C 11/419; G11C 11/54; H03K 19/1737; H03K 19/20; G06N 3/063

See application file for complete search history.

(56) References Cited

U.S. PATENT DOCUMENTS

| | | | | |
|---|---|---|---|---|
| 10,642,922 | B2 * | 5/2020 | Knag | G11C 11/54 |
| 10,755,766 | B2 * | 8/2020 | Hush | G11C 11/405 |
| 2009/0207642 | A1 * | 8/2009 | Shimano | G11C 11/4076 365/72 |
| 2013/0194860 | A1 * | 8/2013 | Cheng | G11C 7/227 365/189.011 |

(Continued)

*Primary Examiner* — Mushfique Siddique

(74) *Attorney, Agent, or Firm* — NICHOLSON DE VOS WEBSTER & ELLIOTT LLP

(57) ABSTRACT

Embodiments herein relate to circuitry which allows data to be processed and written back within an SRAM device. In a toggle operation, a memory cell is read and the bit at the complementary output node of a sense amplifier is written back to the memory cell. In a copy operation, a memory cell is read and the bit at the primary output node of the sense amplifier is written to another memory cell in the column. In another aspect, logic operations such as AND, OR, majority, AND-OR, OR-AND, and associated inverse operations can be performed within the SRAM device. This can involve writing data to one or more control memory cells in the same column as the data memory cells involved in the logic operation, and setting the respective word lines to be active concurrently.

18 Claims, 22 Drawing Sheets

Begin logic operation involving bits of data memory cells in a column 500

Write data to one or more control memory cells in the same column as the data memory cells based on the logic operation 501

If indicated by the logic operation, increase the weight of a selected memory cell by copying its bit to another selected memory cell 502

Pre-charge the bit lines of the column and set the WL high for the data memory cells and the one or more control memory cells 503

Set TOGGLE and MODIFY commands to obtain a bit which is a result of the logic operation from the primary or complementary output node of sense amplifier 504

Write the bit to a memory cell in the column and/ or output the bit to a control circuit 505

(56) References Cited

U.S. PATENT DOCUMENTS

| | | | | |
|---|---|---|---|---|
| 2016/0085627 | A1* | 3/2016 | Marukame | H03M 13/2906<br>714/764 |
| 2016/0188250 | A1* | 6/2016 | Wheeler | G11C 7/1006<br>711/154 |
| 2017/0345505 | A1* | 11/2017 | Noel | G11C 8/16 |
| 2019/0042199 | A1* | 2/2019 | Sumbul | G11C 8/10 |
| 2023/0386564 | A1* | 11/2023 | Dhori | G11C 7/1006 |

* cited by examiner

Control circuit 225
Memory 226
Processor 227
DATAIN
DATAOUT
Write driver 220
TOGGLE
MODIFY
Sense amplifier latch 215
SAOUT
SAOUT_B
Sense amplifier 210
SAPCH
SAEN
RDDATA
RDYSEL_B
RDDATA_B
250
251
BL Pre-charge 205
MCj
MC1
BL
BL_B
WLj
WL1
300
WRDATA
260
WRDATA_B
261
WRYSEL
230
235
240

Figure 4:
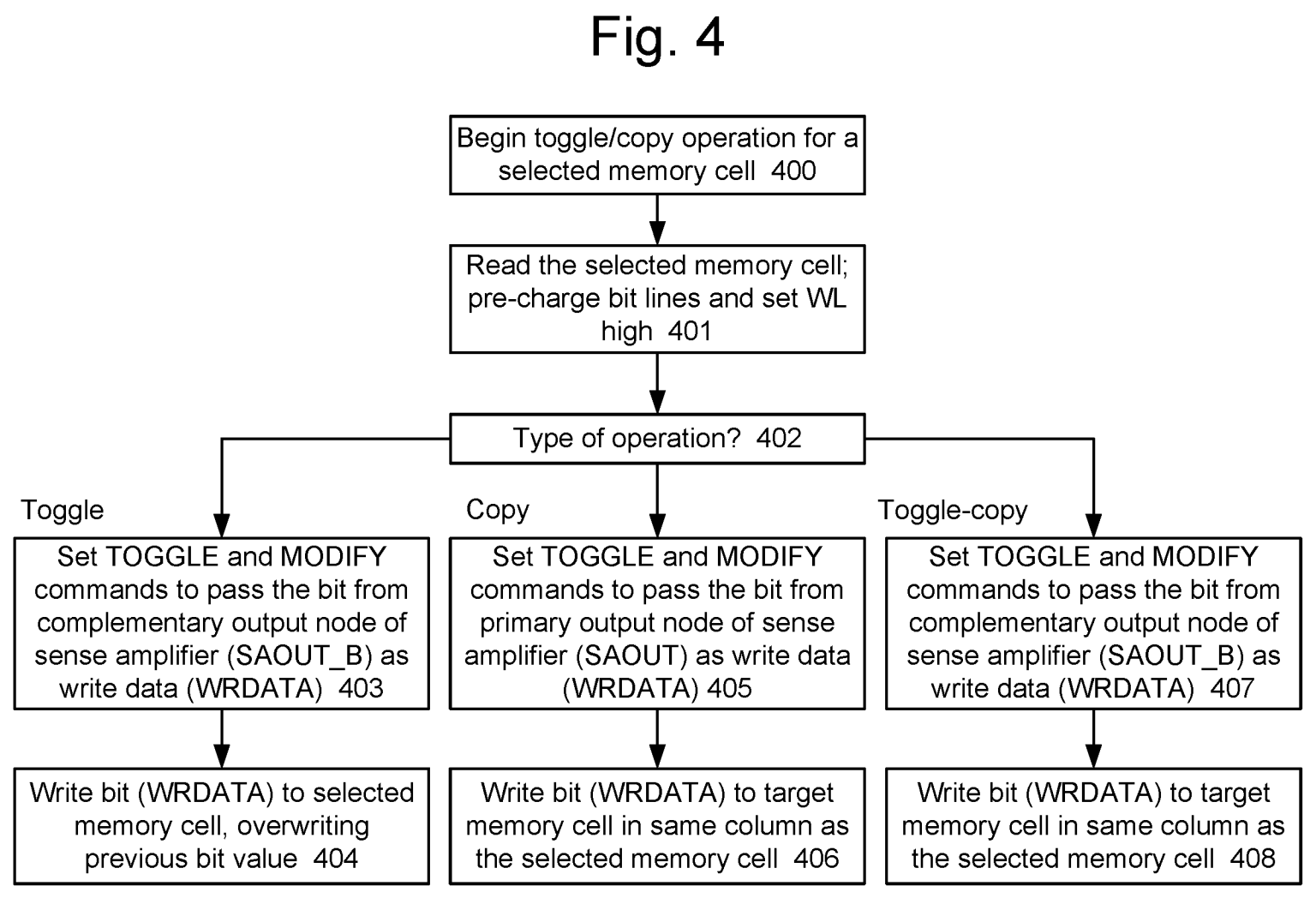

Begin toggle/copy operation for a selected memory cell 400

Read the selected memory cell; pre-charge bit lines and set WL high 401

Type of operation? 402

Toggle

Set TOGGLE and MODIFY commands to pass the bit from complementary output node of sense amplifier (SAOUT_B) as write data (WRDATA) 403

Write bit (WRDATA) to selected memory cell, overwriting previous bit value 404

Copy

Set TOGGLE and MODIFY commands to pass the bit from primary output node of sense amplifier (SAOUT) as write data (WRDATA) 405

Write bit (WRDATA) to target memory cell in same column as the selected memory cell 406

Toggle-copy

Set TOGGLE and MODIFY commands to pass the bit from complementary output node of sense amplifier (SAOUT_B) as write data (WRDATA) 407

Write bit (WRDATA) to target memory cell in same column as the selected memory cell 408

Fig. 5

| Toggle signal | Bit signal | Toggle/XOR operation |
|---|---|---|
| 0 | 0 | 0 |
| 0 | 1 | 1 |
| 1 | 0 | 1 |
| 1 | 1 | 0 |

1465
n0
1455
BL_B
1450
BL
1470
n1
1460
SAOUT n0
VWLA
n1 n1
VWLB
n0

Fig. 17

| Logic operation | Boolean expression | CTR0 |
|---|---|---|
| OR | A+B | 1 |
| AND | AB | 0 |

Fig. 18A

| Logic operation | Boolean expression | Threshold | CTR0 | CTR1 |
|---|---|---|---|---|
| OR | A+B+C | 1 | 1 | 1 |
| Majority | AB+AC+BC | 2 | 1 | 0 |
| AND | ABC | 3 | 0 | 0 |

Fig. 18B

| A | B | C | OUTPUT |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

Fig. 19A
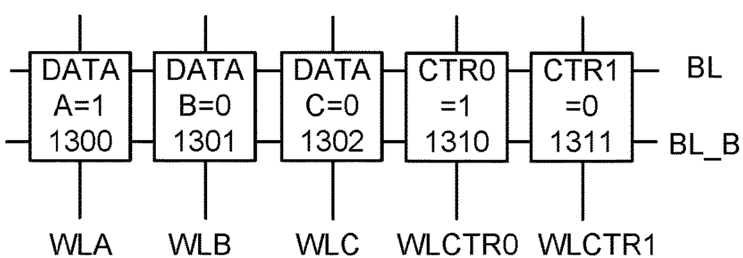
Fig. 19B
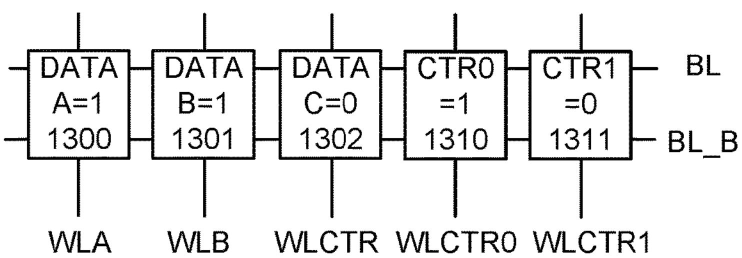
Fig. 20
| Logic operation | Boolean expression | Weights | Threshold | CTR0 | CTR1 | CTR2 |
|---|---|---|---|---|---|---|
| AND-OR | AB+C | WA=1, WB=1,WC=2 | 2 | 1 | 1 | 0 |
| OR-AND | (A+B)C | WA=1, WB=1,WC=2 | 3 | 1 | 0 | 0 |

| Logic operation | Boolean expression | TOGGLE | Weights | CTR0 | CTR1 | CTR2 |
|---|---|---|---|---|---|---|
| OR | A+B+C | 0 | WA=1, WB=1,WC=1 | 1 | 1 | NA |
| Majority | AB+AC+BC | 0 | WA=1, WB=1,WC=1 | 1 | 0 | NA |
| AND | ABC | 0 | WA=1, WB=1,WC=1 | 0 | 0 | NA |
| AND-OR | AB+C | 0 | WA=1, WB=1,WC=2 | 1 | 1 | 0 |
| OR-AND | (A+B)C | 0 | WA=1, WB=1,WC=2 | 1 | 0 | 0 |
| NOR | !(A+B+C) | 1 | WA=1, WB=1,WC=1 | 1 | 1 | NA |
| Minority | !(AB+AC+BC) | 1 | WA=1, WB=1,WC=1 | 1 | 0 | NA |
| NAND | !(ABC) | 1 | WA=1, WB=1,WC=1 | 0 | 0 | NA |
| AND-OR-INVERT | !(AB+C) | 1 | WA=1, WB=1,WC=2 | 1 | 1 | 0 |
| OR-AND-INVERT | !(A+B)C | 1 | WA=1, WB=1,WC=2 | 1 | 0 | 0 |

IN-MEMORY COMPUTE SRAM WITH INTEGRATED TOGGLE/COPY OPERATION AND RECONFIGURABLE LOGIC OPERATIONS

FIELD

The present application generally relates to the field of SRAM memory devices and, more specifically, to the operation of circuits in such memory devices.

BACKGROUND

Memory devices include both volatile and non-volatile memory. One example of volatile memory is Static Random Access Memory (SRAM). SRAM can be used, e.g., to provide a cache memory for a Central Processing Unit (CPU) since it provides fast access speed and low power consumption. In an SRAM device, the memory cells are arranged in rows and columns, where each row is associated with a word line and each column is associated with a pair of bit lines. In a read operation, a row of cells is selected. For each selected cell, the associated pair of bit lines is pre-charged and the cell communicates with the bit lines so that voltages develop on the bit lines based on the data stored in the cell. An associated sense amplifier (sense amp) is then enabled to detect the bit line voltages and output a corresponding bit of data. However, various challenges and limitations are presented in operating such memory devices.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 3 depicts an example configuration of the bit line pre-charge circuit 205, memory cell MC1, sense amplifier 210 and write driver 220 of FIG. 2, in accordance with various embodiments.

FIG. 4 depicts a flowchart of an example process for performing a toggle/copy operation, in accordance with various embodiments.

FIG. 5 depicts a flowchart of an example process for performing a logic operation, in accordance with various embodiments.

FIG. 17 depicts an example table of logic operations that can be implemented for two data memory cells having bit values A and B, consistent with FIG. 13A to 16G, in accordance with various embodiments.

FIG. 18A depicts an example table of logic operations that can be implemented for three data memory cells having bit values A, B and C, consistent with FIGS. 19A and 19B, in accordance with various embodiments.

FIG. 18B depicts an example truth table for the majority function of FIG. 18A.

FIG. 19A depicts a column of memory cells in a majority (A, B, C) logic operation consistent with the process of FIG. 5, and with the tables of FIGS. 18A and 18B, including a first data memory cell 1300 with data A=1, a second data memory cell 1301 with data B=0, a third data memory cell 1302 with data C=0, a first control memory cell 1310 with data CTR0=1, and a second control memory cell 1311 with data CTR1=0.

FIG. 19B depicts a column of memory cells in a majority (A, B, C) logic operation consistent with the process of FIG. 5, including a first data memory cell 1300 with data A=1, a second data memory cell 1301 with data B=1, a third data memory cell 1302 with data C=0, a first control memory cell 1310 with data CTR0=1, and a second control memory cell 1311 with data CTR1=0.

FIG. 20 depicts an example table of logic operations AND-OR and OR-AND for three data memory cells A, B and C, in accordance with various embodiments.

DETAILED DESCRIPTION

Figure 1:
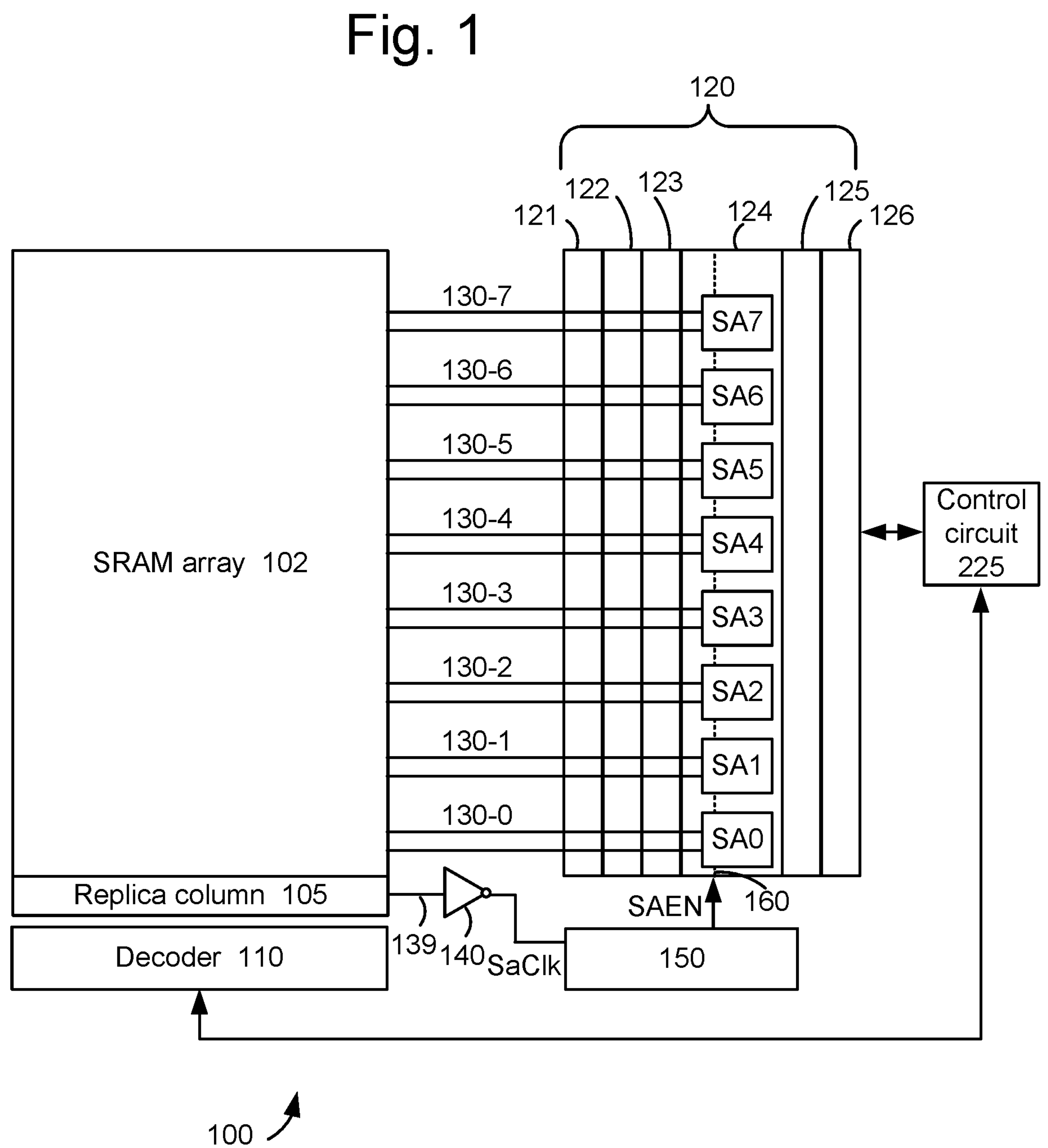
FIG. 1 illustrates an example SRAM device in accordance with various embodiments.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

The terms "coupled," "communicatively coupled," along with derivatives thereof are used herein. The term "coupled" may mean two or more elements are in direct physical or electrical contact with one another, may mean that two or more elements indirectly contact each other but still cooperate or interact with each other, and/or may mean that one or more other elements are coupled or connected between the elements that are said to be coupled with each other. The term "directly coupled" may mean that two or more elements are in direct contact with one another. The term "communicatively coupled" may mean that two or more elements may be in contact with one another by a means of communication including through a wire or other interconnect connection, through a wireless communication channel or link, and/or the like.

As mentioned at the outset, various challenges and limitations are presented in operating memory devices such as SRAM memory devices. SRAM devices are volatile, and can be used for cache storage due to their relatively high access speed. In general, SRAM devices have been designed purely for storing data, while operations involving data from the memory cells are performed outside the device. Results from the operations can then be written back to the SRAM. For example, in a standard Von Neumann architecture, data is stored in caches, then sent to an execution unit for processing. However, this approach incurs a performance latency since the data must be sent from the cache, scheduled, processed in another unit, and sent back to the cache to write back the result.

The techniques provided herein address the above and other issues. In one aspect, a change to the SRAM circuitry is provided to allow data to be processed and written back within the SRAM device. A number of advantages can be achieved, including faster execution time, reducing throughput or memory bottlenecks, freeing up execution units for more complicated operations (e.g., add, multiply) by performing less complicated operations inside the SRAM, and reducing SRAM cache area and die cost. The operations within the SRAM device can extend beyond standard read and write operations to include toggle and copy operations. An atomic read-modify-write operation can be provided, where the modify portion is a toggle or copy operation. Moreover, these operations can be performed for groups of bits from respective memory cells or individual bits from individual memory cells, e.g., on a per-bit basis.

In another aspect, logic operations such as AND, OR, majority, AND-OR, OR-AND, and associated inverse operations can be performed within the SRAM device. This can involve writing data to one or more control memory cells in the same column as the data memory cells involved in the logic operation, and setting the respective word lines to be active concurrently. The multiple active memory cells cause the bit line voltages to develop based on their data states such that an output bit of the sense amp is a result of the logic operation. For some operations, a bit in a data memory cell is copied to another memory cell to increase the weight of the associated bit in the logic operation.

The above and other advantages are discussed further below.

FIG. 1 illustrates an example SRAM device in accordance with various embodiments. The SRAM device 100 includes memory cells in an SRAM array 102 and in a replica column 105. The memory cells are arranged in rows and columns, where each row is associated with a word line and each column is associated with a pair of bit lines. A decoder 110 performs function such as decoding a control signal to select a word line for a read or write operation. In this simplified example, there are eight columns which extend horizontally in the figure. Pairs of bits lines 130-0 to 130-7 are associated with the columns. See FIGS. 2 and 3 for further details.

The SRAM device 100 also includes a set of circuits 120 associated with the SRAM array, including a write column multiplexer (mux) 121, a read column mux 122, a bit line pre-charge circuit 123, a set of sense amplifiers 124 including example sense amps SA0-SA7, a read latch 125 and a write driver 126. The sense amps SA0-SA7 sense the data state of a selected memory cell using the bit line pairs 130-0 to 130-7, respectively.

A control circuit 225 can communicate with the set of circuits such as to receive read data, provide write data and provide various control signals are described herein. The control circuit 225 can also communicate with the decoder 110. The control circuit can comprise, e.g., a processor or a state machine, and can be implemented using hardware, software and/or firmware, for example. The SRAM device can be provided as part of a cache, in one example implementation. See also FIG. 23.

A circuit 150 is configured to provide a sense amp enable signal SaEn on a conductive path 160 which is connected to each of the sense amps. The control circuit is responsive to a clock signal SaClk which is received from the replica column via an inverter 140. The replica column contains replica memory cells that are essentially identical to the cells in the array. During a read operation, a replica word line signal is asserted, turning on a fixed number of replica cells, also referred to as driver cells, which discharge a replica bit line 139. The driver cells are hardwired to store "0" while the remaining replica cells act as dummy loads on the replica bit line. The full-swing signal on the replica bit line signal is then inverted and buffered at the inverter 140 to generate SaClk.

Figure 2:
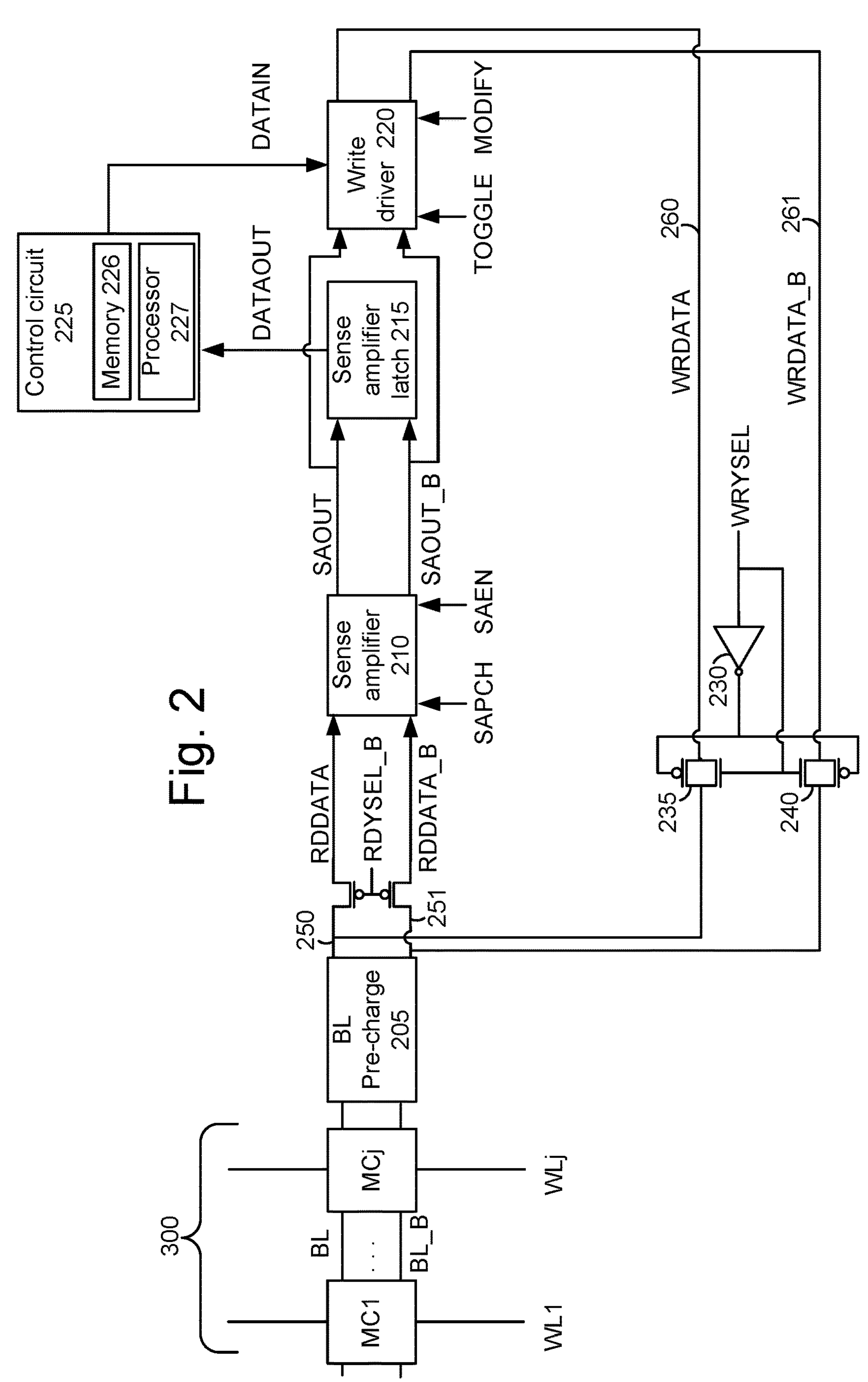
FIG. 2 depicts an example implementation of sensing and writing circuits for a column of memory cells, consistent with FIG. 1 and in accordance with various embodiments.

FIG. 2 depicts an example implementation of sensing and writing circuits for a column of memory cells, consistent with FIG. 1 and in accordance with various embodiments. The column 300 includes example memory cells MC1, . . . , MCj which are coupled to respective word lines WL1, . . . , WLj. The column includes a primary bit line, BL, and a complementary bit line, BL_B which are coupled to each of the memory cells in the column and to a bit line (BL) pre-charge circuit 205. The notation "_B" denotes "bar" or inverse. The bit line pre-charge circuit pre-charges the bit lines during read and write operations as described further below. The bit lines extend further to a sense amplifier 210 via respective pMOS transistors. These transistors have their control gates connected to a control signal RDYSEL_B in a read operation. When RDYSEL_B is low, the transistors are provided in a conductive state so that the voltages on the bit lines can reach the sense amplifier. These voltages are represented by RDDATA (read data) and RDDATA_B on BL and BL_B, respectively, at nodes 250 and 251, respectively.

Figure 3:
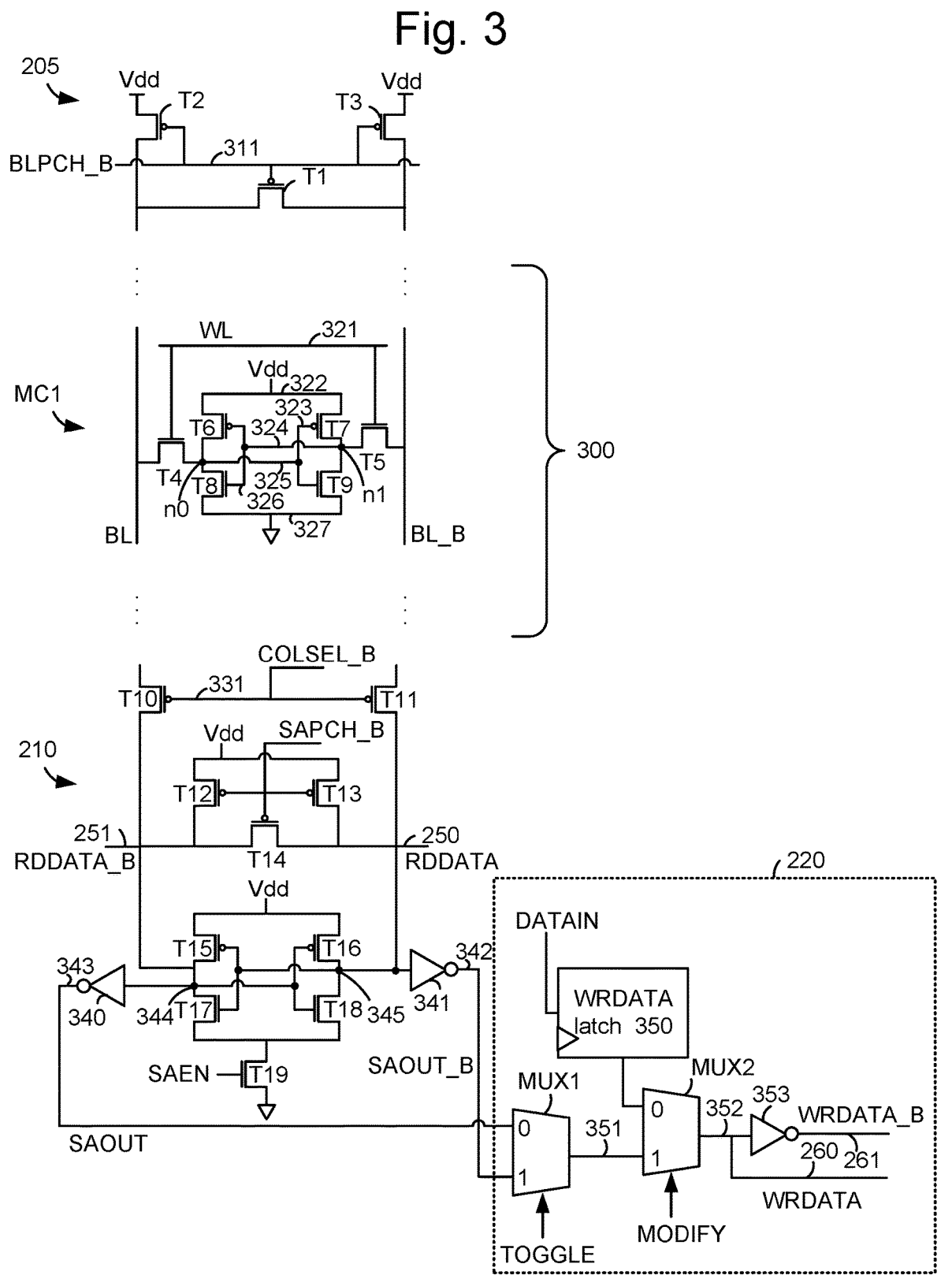

The sense amp 210 is responsive to control signals including SAPCH for sense amp pre-charge and SAEN for sense amp enable. The sense amp outputs read data including SAOUT and SAOUT_B based on the data on BL and BL_B, respectively. SAOUT and SAOUT_B are output from primary and complementary output nodes, respectively. This data can be provided to a sense amp latch 215 for output to the control circuit 225 as DATAOUT and to a write driver 220 for writing back to the column. As depicted in FIG. 3, the write driver is responsive to control signals TOGGLE and MODIFY. If TOGGLE and MODIFY are active, the write driver outputs the bit from SAOUT_B as the write data WRDATA, and the inverse bit SAOUT as the inverse write data WRDATA_B. This allows the inverse bit to be written back to the column in a toggle operation. For a 0 bit, the 1 bit is the inverse bit and for a 1 bit, the 0 bit is the inverse bit. If TOGGLE is inactive, the write driver outputs the bit from SAOUT as the write data WRDATA, and the inverse bit SAOUT_B as the inverse write data WRDATA_B. This allows the bit from SAOUT to be written back to the column in a copy operation. If MODIFY is inactive, the write driver outputs DATAIN as WRDATA and the inverse bit DATAIN_B as the inverse write data WRDATA_B. This allows the bit from DATAIN to be written to the column in a write operation. The TOGGLE setting does not matter is this case.

Referring still to FIG. 2, WRDATA and WRDATA_B are provided on paths 260 and 261 to pMOS transistors 235 and 240, respectively. The path 260 is a first write data path coupled from the write driver to the primary bit line at node 250, and the path 261 is a second write data path coupled from the write driver to the complementary bit line at node 251. The first write data path is coupled directly to the output node 352 of the second multiplexer, and the second write data path is coupled to the output node of the second multiplexer via an inverter 353.

The transistors 235 and 240 are arranged as transmission gates which pass the respective data when WRYSEL, a column write select signal, is active. WRYSEL is provided to an inverter 230, such that WRYSEL_B is provided to the control gates of the transistors. When WRYSEL is high, WRYSEL_B will be low so that the transistors will be conductive, passing WRDATA and WRDATA_B to BL and BL_B, respectively, for writing a bit to a select memory cell in the column. In a toggle operation, the write operation is a write back to the same memory cell which was read. In a copy operation, the write operation is to a different memory cell, other than the memory cell which was read. Further, in a normal or non-toggle-copy operation, WRDATA=SAOUT, so the bit which was read from the memory cell selected for reading is written to a different memory cell selected for writing, all in a common column of memory cells. In a toggle-copy operation, WRDATA=SAOUT_B, so the inverse of the bit which was read from the memory cell selected for reading is written to the memory cell selected for writing.

In one approach, when the bit passed to the first write data path is the bit from the complementary output node, the write driver is to write the bit from the complementary output node to the first SRAM memory cell in a toggle operation. In another approach, when the bit passed to the first write data path is the bit from the primary output node, the write driver is to write the bit from the primary output node to a second SRAM memory cell in a common column with the first SRAM memory cell in a copy operation. In another approach, when the bit passed to the first write data path is the bit from the complementary output node, the write driver is to write the bit from the complementary output node to a second SRAM memory cell in a common column with the first SRAM memory cell in a toggle-copy operation.

The control circuit 225 can include a memory device 226 to store instructions, and a processor 227 to execute the instructions to perform the techniques discussed herein, including toggle/copy and logic operations.

FIG. 3 depicts an example configuration of the bit line pre-charge circuit 205, memory cell MC1, sense amplifier 210 and write driver 220 of FIG. 2, in accordance with various embodiments. The memory cell is an example cell in the column of memory cells 300. The bit line pre-charge circuit is configured to charge up the bit line pair for the column, and the sense amp is configured to sense a voltage differential on the bit line pair to determine the data state of the cell.

The figures depict nMOSFETs and pMOSFETs (with a circle on the gate). A MOSFET refers to a metal oxide semiconductor field-effect transistor.

In a bit line pair, BL is a primary bit line and BL_bar is a complementary bit line.

In the bit line pre-charge circuit 205, when a bit line pre-charge signal BLPCH_B is enabled (active low) on a control line 311, the transistors T1-T2 are provided in a conductive state. This provides a power supply voltage, Vdd, on the bit lines BL and BL_bar, where the potential is equalized on the bit lines.

The example memory cell MC1 has a six transistor (6T) configuration, with transistors tT4-T9. To read a value stored in the memory cell, the associated word line (WL) 321 is enabled with the signal WL (active high), after the bit lines have been pre-charged. The nodes n0 and n1 provide complementary bit values, where the bit value at node n0 is considered to be the value stored by the memory cell. The node n1 is connected to the path 326 by a path 324, and the node n0 is connected to the path 323 by a path 325.

The memory cell further includes pull-up pMOSFETs T6 and T7 and pull-down nMOSFETs T8 and T9. T6 and T8 have their gates connected by a path 326 which is coupled to the node n1, and T7 and T9 have their gates connected by a path 323 which is coupled to the node n0. Vdd is applied at a path 322. A path 327 is connected to ground.

An nMOSFET access transistor T4 is coupled to BL and to the node n0, while an nMOSFET access transistor T5 is similarly coupled to BL_bar and to the node n1. A gate terminal of each of the access transistors T4 and T5 is coupled to the word line. Enabling the WL electrically connects BL to the node n0 and BL_bar to the node n1.

As an example, assume a bit value at the node n0 is "1" (Vdd) and a bit value at the node n1 is "0" (0 V). Consequently, T6 is turned on and T8 is turned off by the voltage at the node n1, thereby holding the voltage at the node n0 to Vdd. Similarly, the voltage at the node n0 turns off T7 and turns on T9, thereby coupling node n1 to ground. A turn on state refers to a conductive state and a turn off state refer to a non-conductive state.

At the beginning of a read operation, BL and BL_bar are pre-charged to the supply voltage by setting the BLPCH signal to an active level. BLPCH is subsequently set to an inactive level and the word line signal is set to an active level to electrically connect BL to the node n0 and BL_bar to the node n1. Since both BL and the node n0 were charged to the supply voltage prior to enabling the word line signal, the voltage on BL remains substantially unchanged. However, the voltage on BL_bar will dip due to its direct path through T5 and T9 to ground. The sense amplifier 210 coupled to the bit line pair senses the resulting difference between the voltages on the bit lines to determine that memory cell stores a bit value of "1".

The sense amp comprises cross-coupled inverters that convert the bit-line voltage difference at their input to a full swing output. The inverters are formed by T15 and T17 and by T16 and T18. The transistor T19 is a grounding transistor which is used to enable the sense amplifier in response to the sense amp enable signal SAEN (active high).

The internal nodes 344 and 345 are isolated from an external load by output inverters 340 and 341, respectively. In the pre-charge phase, SAPCH_B is kept active low so that bit lines and the nodes 344 and 345 are pre-charged high via T12 and T13. In particular, T12-T14 are used to pass a sense amp pre-charge voltage of Vdd to the internal nodes 344 and 345.

During an evaluation phase, the sense amplifier is connected to the memory cell by pulling down a column select signal (COLSEL_B) on a path 331 to provide transistors T10 and T11 in a conductive state. A voltage difference is developed between the bit lines as a function of the stored data in the memory cell. If the data stored in the memory cell is a "1," the voltage across BL_bar decreases slightly. If the stored data in the memory cell is a "0," the voltage across BL decreases slightly. Once the differential voltage has been developed beyond a threshold between the bit lines, SAEN is pulled high to enable the sense amplifier.

The sense amp converts a relatively small voltage differential between the two bit lines at an input to the sense amp to a full swing difference at the outputs of the sense amp. The outputs comprise the bit values SAOUT and SAOUT_B at output nodes 343 and 342, respectively. Because of the voltage difference on the bit lines, one of the output bits is 0 and the other is 1. For example, a "1" bit in the memory cell may correspond to SAOUT=1 and SAOUT_B=0, and a "0" bit in the memory cell may correspond to SAOUT=0 and SAOUT_B=1.

The write driver 220 receives the bits SAOUT and SAOUT_B at 0 and 1 inputs, respectively, of a first multiplexer MUX1. If the control signal for MUX1, TOGGLE=0, SAOUT is passed on the output node 351 to the 1 input of a second multiplexer MUX2. If TOGGLE=1, SAOUT_B is passed on the output node 351. If the control signal for MUX2, MODIFY=0, DATAIN is passed at the 0 input of MUX2 to the output node 352. TOGGLE and MODIFY can both be one bit select signals in this example. TOGGLE and MODIFY are examples of one or more control signals.

DATAIN is provided by a write data latch (WRDATA) 350. If MODIFY=1, the bit on the output node 351 of MUX1 is passed to the output node 352 of MUX2. An inverter 353 inverts the bit on the output path 352 to provide the complementary or inverted write data WRDATA_B, while a path 260 which is connected to the path 352 provides the bit on the output path 352 as the primary or non-inverted write data WRDATA.

This implementation of the write circuit is an example only. In another possible implementation, a further multiplexer is used to provide the option to output SAOUT or SAOUT_B from the write driver without writing it back to the column. Another possible implementation provides one multiplexer to replace MUX1 and MUX2. This one multiplexer can pass SAOUT, SAOUT_B or DATAIN based on a two bit select signal, for example.

In comparative circuits, the SAOUT output of the sense amp typically feeds the read data out path, while the SAOUT_B output goes unused (i.e., is left floating). In an atomic toggle operation as described herein, the SAOUT_B output is now a functional path. Both TOGGLE and MODIFY signals are introduced in the write driver to select SAOUT_B onto the WRDATA and WRDATA_B data paths. The TOGGLE and MODIFY signals remain high while the WL and WRYSEL are open.

FIG. 4 depicts a flowchart of an example process for performing a toggle/copy operation, in accordance with various embodiments. Step 400 begins a toggle/copy operation for a selected memory cell. Step 401 involves reading the selected memory cell, including pre-charging the bit lines and setting the WL high (active). Step 402 determines a type of the operation. For a toggle operation, step 403 includes setting the TOGGLE and MODIFY commands to pass the bit from the complementary output node of the sense amplifier (SAOUT_B) as write data (WRDATA). Step 404 includes writing the bit (WRDATA) to the selected memory cell, overwriting the previous bit value.

For a copy operation, step 405 includes setting the TOGGLE and MODIFY commands to pass the bit from the primary output node of the sense amplifier (SAOUT) as write data (WRDATA). Step 406 includes writing the bit (WRDATA) to a target memory cell, different than the selected memory cell, in the same column as the selected memory cell.

For a toggle-copy operation, step 407 includes setting the TOGGLE and MODIFY commands to pass the bit from the complementary output node of the sense amplifier (SAOUT_B) as write data (WRDATA). Step 408 includes writing the bit (WRDATA) to a target memory cell, different than the selected memory cell, in the same column as the selected memory cell.

Examples of the process of FIG. 4 are provided, e.g., in connection with FIG. 6A-12.

Figure 5:
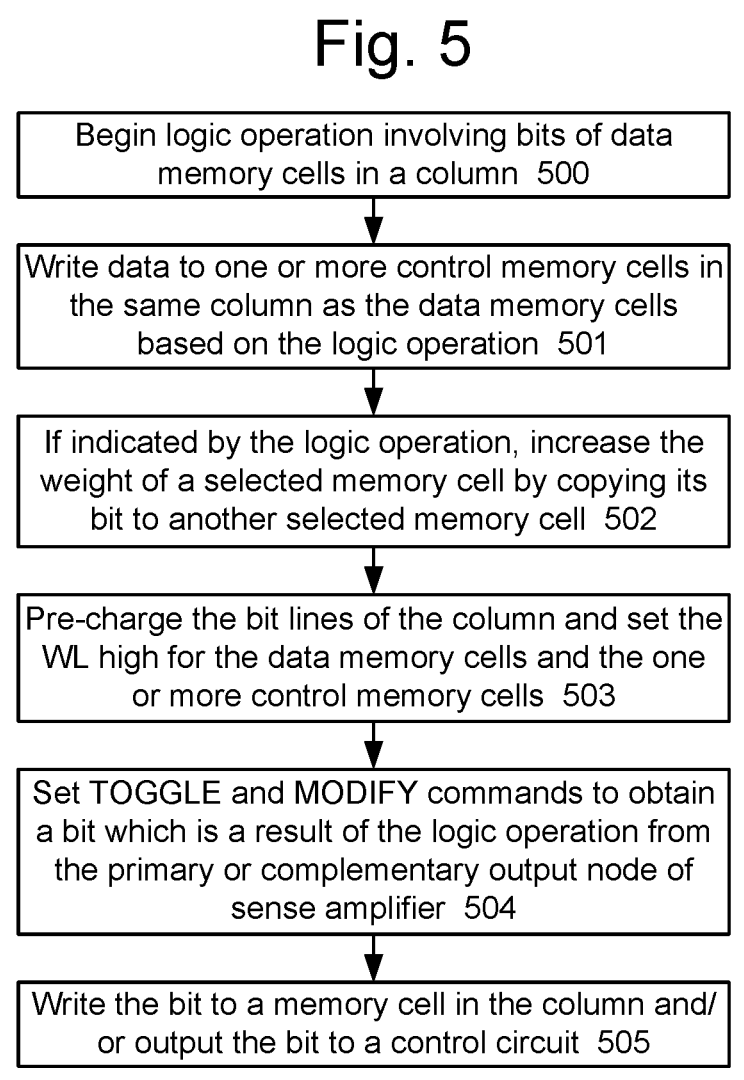

FIG. 5 depicts a flowchart of an example process for performing a logic operation, in accordance with various embodiments. Step 500 begins a logic operation involving bits of data memory cells in a column. A data memory cell refers to a memory cell which stores a bit of data which is subject to a logic operation. Step 501 includes writing data to one or more control memory cells in the same column as the data memory cells based on the logic operation. A control memory cell refers to a memory cell which is configured to bias or control a read result of data memory cells to achieve a logic operation for the data memory cells. Step 502 includes, if indicated by the logic operation, increasing the weight of a selected memory cell by copying its bit to another selected memory cell. The bit can be copied to one or more other selected memory cells.

Step 503 includes pre-charging the bit lines of the column and setting the WL high for the data memory cells and the one or more control memory cells. Step 504 includes setting the TOGGLE and MODIFY commands to obtain a bit which is a result of the logic operation from the primary or complementary output node of sense amplifier. Step 505 includes writing the bit to a memory cell in the column and/or outputting the bit to a control circuit. When outputting the bit to a control circuit the control circuit is to receive the bit comprising the result of the logic operation from the primary or complementary output node of the sense amplifier.

Examples of the process of FIG. 5 are provided, e.g., in connection with FIG. 13A-22.

In the processes of FIGS. 4 and 5, in theory, the bit could be written to a memory cell in a different column if additional circuitry was provided.

The processes of FIGS. 4 and 5 can be executed at the control circuit 225, for example.

Figure 6A:
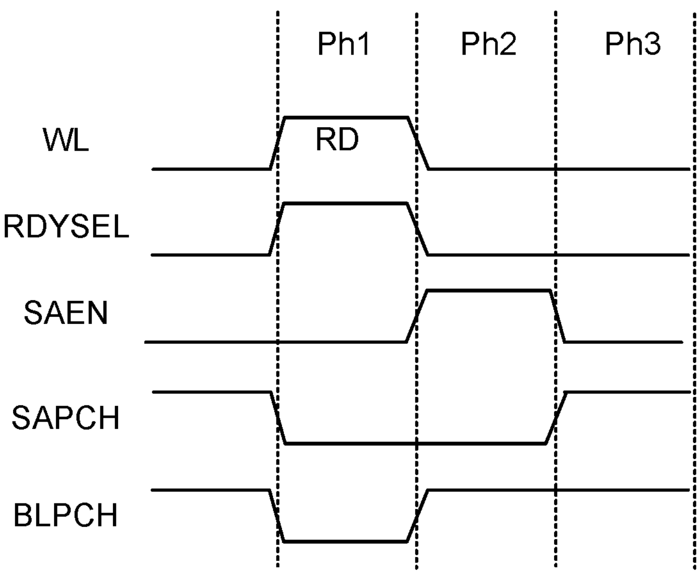
FIG. 6A depicts example voltage signals in a read operation consistent with the process of FIG. 4, in accordance with various embodiments.

FIG. 6A depicts example voltage signals in a read operation (RD) consistent with the process of FIG. 4, in accordance with various embodiments. As mentioned, an SRAM normally performs either a read or write operation. The following describes a new toggle operation which acts as an atomic read-modify-write for the SRAM memory. This toggle operation is in addition to the read and write operations. The example here uses a synchronous memory with a coupled sense amp (e.g., every other cycle access), but the concept can be extended to other types of designs (e.g., decoupled sense amp with every cycle access, self-timed).

A synchronous SRAM with a coupled sense amp operates across phases. For a read operation, at least three phases are used, e.g., a word line (WL) phase (Ph1), a sense amp enable (SAEN) phase (Ph2), and a sense amp pre-charge (SAPCH) phase (Ph3). In particular, the voltage signals include WL, the WL voltage, RDYSEL, the signal used to pass the bit line voltages to the sense amp in FIG. 2, SAEN, the sense amp enable signal in FIG. 1-3, SAPCH, the sense amp pre-charge signal in FIGS. 2 and 3, and BLPCH, the bit line pre-charge signal in FIG. 3. The voltage signals are active high.

Figure 6B:
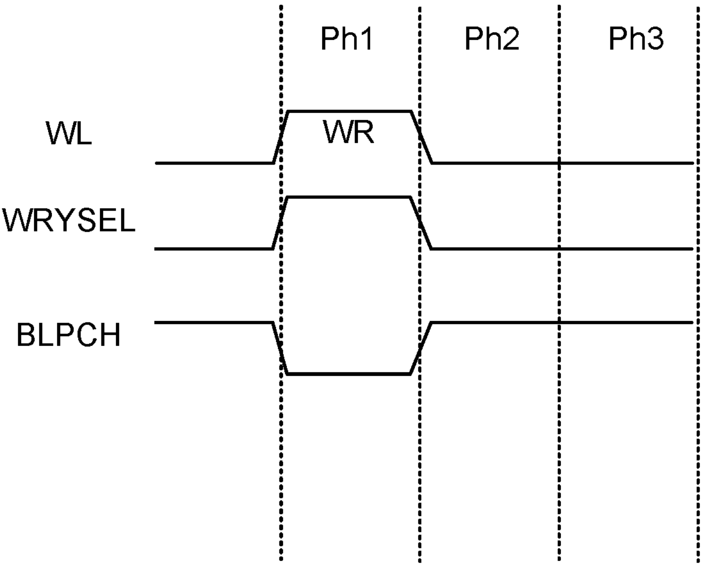
FIG. 6B depicts example voltage signals in a write operation consistent with the process of FIG. 4, in accordance with various embodiments.

FIG. 6B depicts example voltage signals in a write operation (WR) consistent with the process of FIG. 4, in accordance with various embodiments. For a write operation, two phases are used, e.g., a WL phase (Ph1) and a bit line pre-charge (BLPCH) phase (Ph2).

Figure 7A:
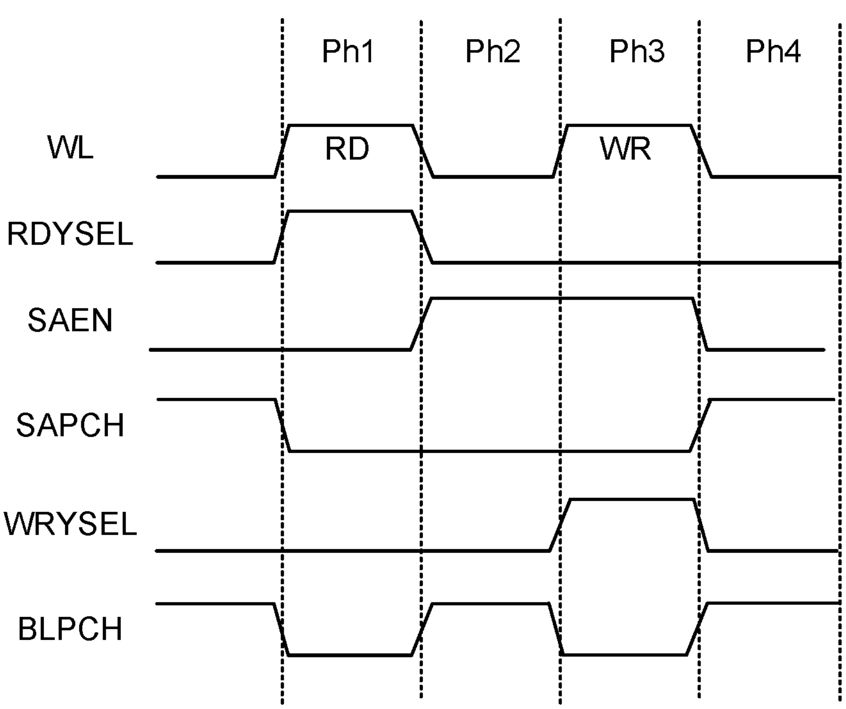
FIG. 7A depicts example voltage signals in a toggle operation consistent with the process of FIG. 4, with every other cycle access, in accordance with various embodiments.

FIG. 7A depicts example voltage signals in a toggle operation consistent with the process of FIG. 4, with every other cycle access, in accordance with various embodiments. For a traditional read-modify-write sequence, a minimum of five phases are used to perform a read operation followed by a write operation. Often times, however, each operation is rounded up to occur across four phases in a synchronous SRAM with every other cycle access (i.e., access across two cycles). Hence, the real cost for performing a read-modify-write is eight phases.

An atomic toggle operation as described herein can speed up the process. In this operation, the WL voltages and the control signals can be allocated as follows. Ph1: WL and RDYSEL are activated so that the memory cell develops a read differential across BL and BL_B. Ph2: SAEN is activated to detect the differential and the sense amp produces a corresponding full-rail output. Ph3: WRYSEL is activated, and the inverted output of the sense amp (SAOUT_B) propagates onto the BL and BL_B. Here, SAEN remains high, and the sense amp acts as a latch to hold the inverted output while WRYSEL and WL are active. By the end of the phase, the inverted value will be written into the memory cell. Ph4: SAPCHG and BLPCH are active to pre-charge the sense amp and the BLs for the next operation.

The atomic toggle operation occurs across four phases and aligns nicely with the pipeline for a synchronous SRAM with every other cycle access.

Figure 7B:
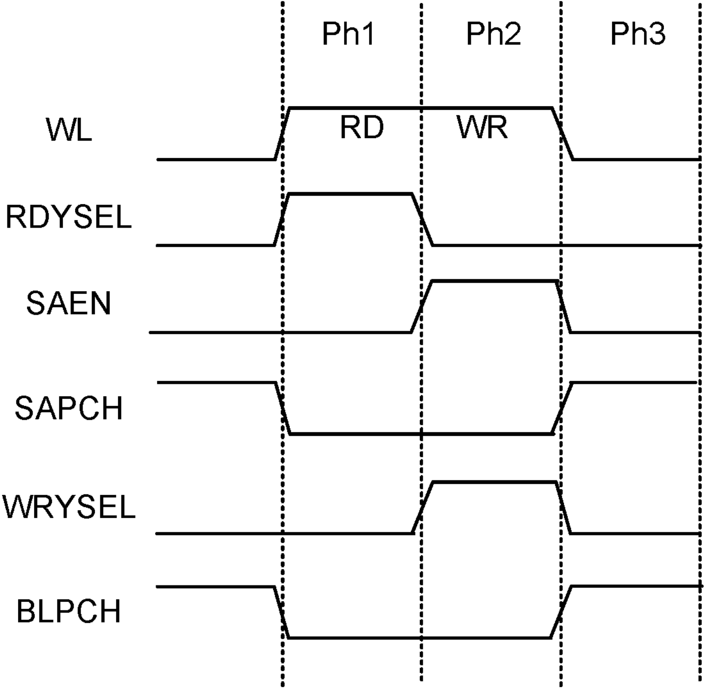
FIG. 7B depicts example voltage signals in a toggle operation consistent with the process of FIG. 4, with a minimum of three phases, in accordance with various embodiments.

FIG. 7B depicts example voltage signals in a toggle operation consistent with the process of FIG. 4, with a minimum of three phases, in accordance with various embodiments. One option is to remove the activation of BLPCH in phase 2. Since the write operation follows the read operation, the write driver can be used to pull up BL and pull down BL_B (or vice-versa, i.e., pull up BL_B and pull down BL). Here, WL remains continuously high throughout the read and write phases. SAEN is high in phase 2 to allow the sense amp to act as a latch. In this manner, the atomic toggle operation is shortened to just three phases.

Figure 7C:
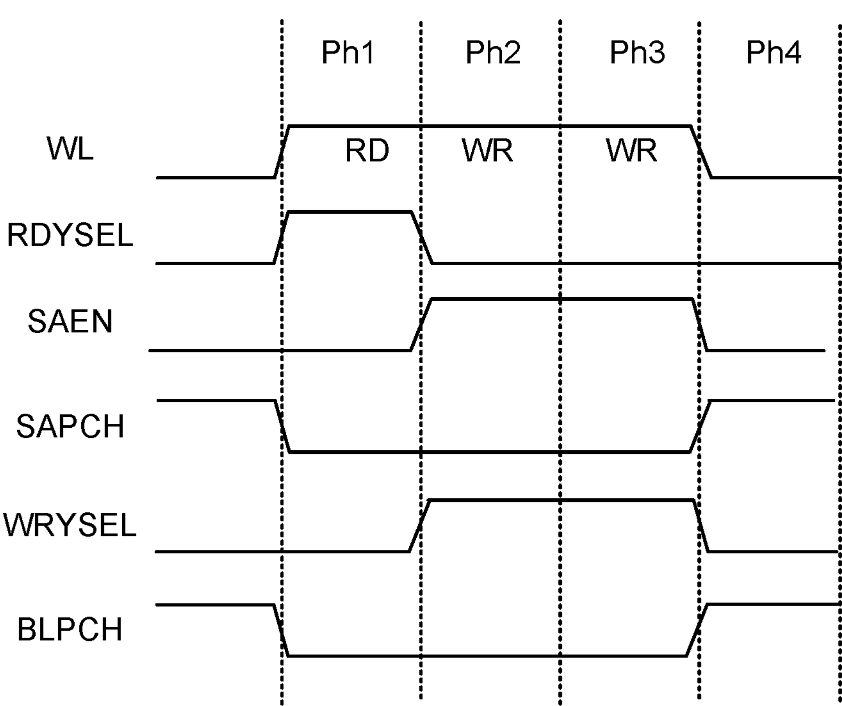
FIG. 7C depicts example voltage signals in a toggle operation consistent with the process of FIG. 4, with an additional phase for a write word line, in accordance with various embodiments.
Figure 7D:
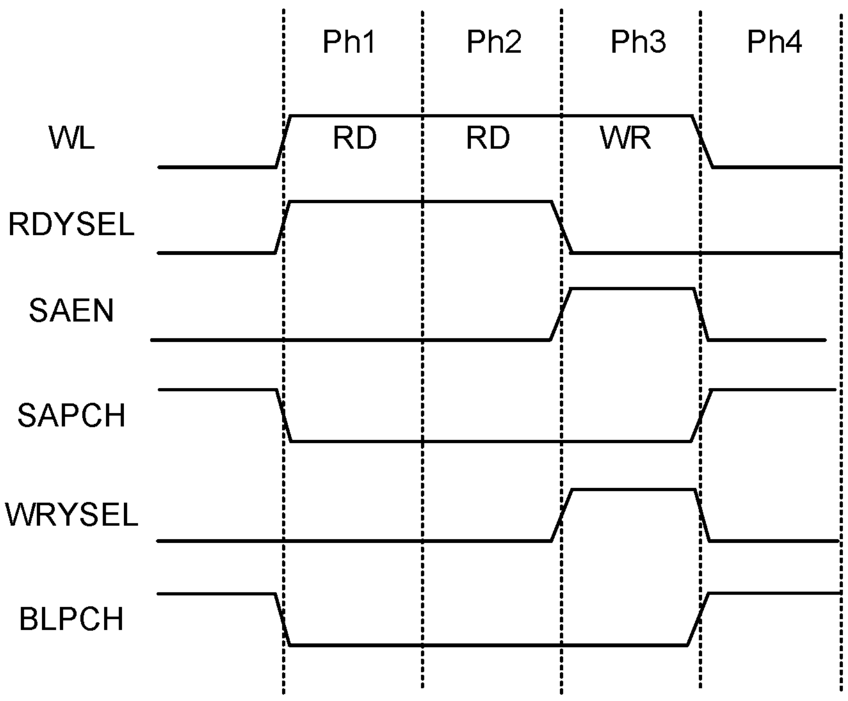
FIG. 7D depicts example voltage signals in a toggle operation consistent with the process of FIG. 4, with an additional phase for a read word line, in accordance with various embodiments.

FIG. 7C depicts example voltage signals in a toggle operation consistent with the process of FIG. 4, with an additional phase for a write word line, in accordance with various embodiments. In the examples of FIGS. 7C and 7D, four full phases are used, and the one additional phase is allocated for either write (FIG. 7C) or read. The allocation decision can be based on the needs of a particular implementation. For example, if an SRAM is write Vmin limited, then the extra phase is allocated for the write WL. If an SRAM is read performance limited, then the extra phase is allocated for the read WL. Here, phase 3 is the extra phase allocated for writing (WR). SAEN is high in phase 3 to allow the sense amp to act as a latch. Though the WL widths are quantized into phases in these examples, the signals here can be delayed or chopped to realize read and write WLs that are 1.5 phases wide.

FIG. 7D depicts example voltage signals in a toggle operation consistent with the process of FIG. 4, with an additional phase for a read word line, in accordance with various embodiments. Here, phase 3 is the extra phase allocated for reading (RD). SAEN is set high in phase 3 to allow the sense amp to act as a latch.

Figure 8A:
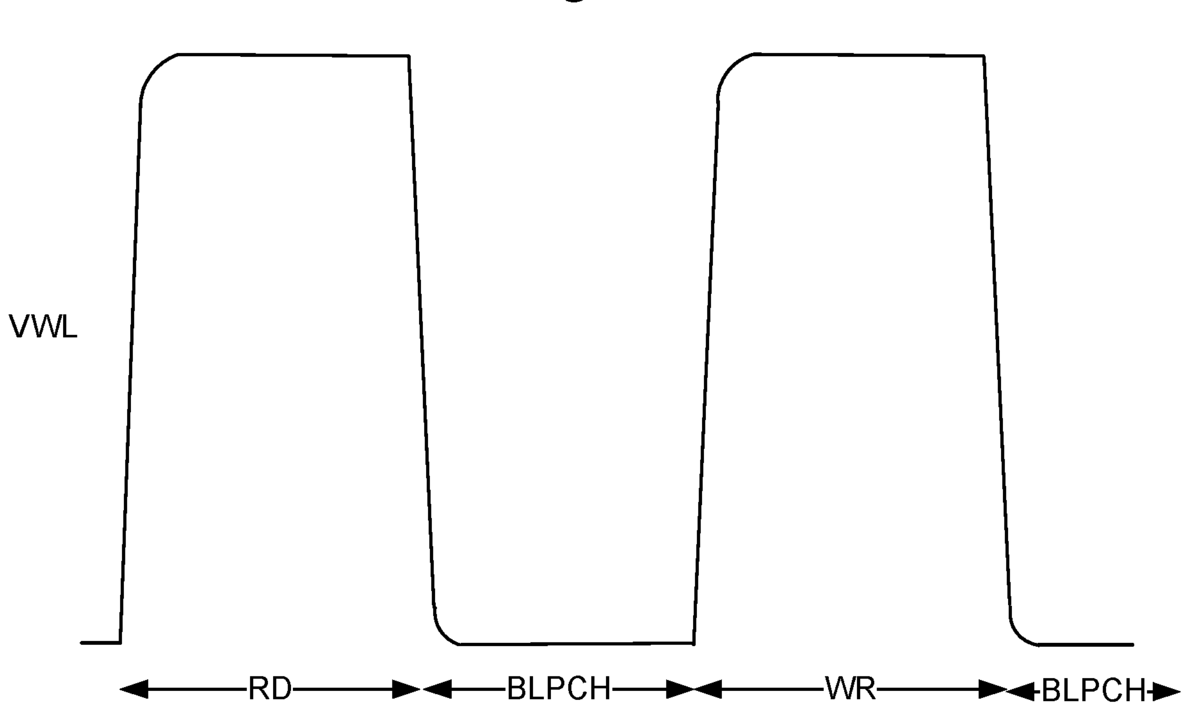
FIG. 8A depicts an example word line voltage signal in a toggle operation, in a sequence which includes a read (RD) phase, a bit line pre-charge (BLPCH) phase, a write (WR) phase and another BLPCH phase, in accordance with various embodiments.
Figure 8B:
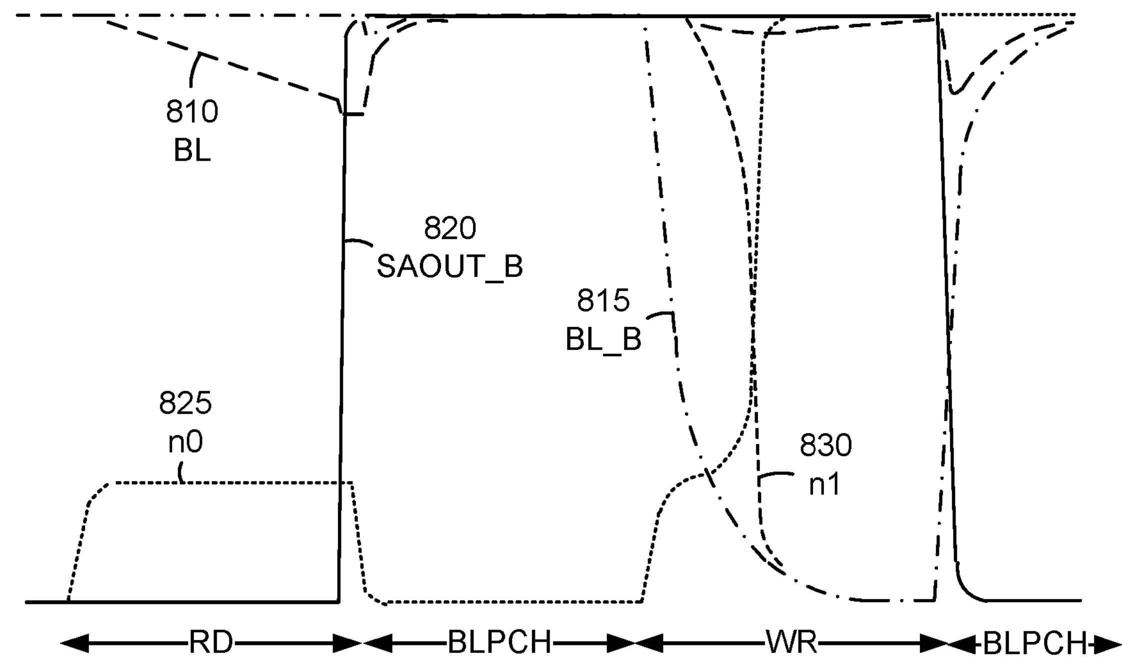
FIG. 8B depicts example voltages which develop on a primary bit line (BL), a complementary bit line (BL_B), a complementary output node of a sense amp (SAOUT_B), a first node (n0) and a second node (n1), consistent with FIG. 8A, in accordance with various embodiments.

FIG. 8A depicts an example word line voltage signal (WL) in a toggle operation, in a sequence which includes a read (RD) phase, a bit line pre-charge (BLPCH) phase, a write (WR) phase and another BLPCH phase, in accordance with various embodiments. FIG. 8B depicts example voltages which develop on a primary bit line (BL), a complementary bit line (BL_B), a complementary output node of a sense amp (SAOUT_B), a first node (n0) and a second node (n1), consistent with FIG. 8A, in accordance with various embodiments.

Simulations were performed to validate the circuit functionality of a memory cell storing "0" and toggling to "1." FIGS. 8A and 8B show a sequence with a RD phase, a BLPCH phase, a WR phase and a portion of another BLPCH phase. The plots 810, 815, 820, 825 and 830 depict the voltages of BL, BL_B, SAOUT_B, n0 and n1, respectively. Recall that n0 and n1 are the first and second nodes, respectively of the memory cell MC1 in FIG. 3.

Here, the BL develops a differential to read a "0" during the RD phase. By the end of the RD phase, SAEN is activated and SAOUT_B switches to "1." SAOUT_B remains high during the first BLPCH phase and the WR phase since the sense amp holds its value. By the end of the WR phase, the memory cell is written with a "1," which is represented by n0 going high.

Figure 9A:
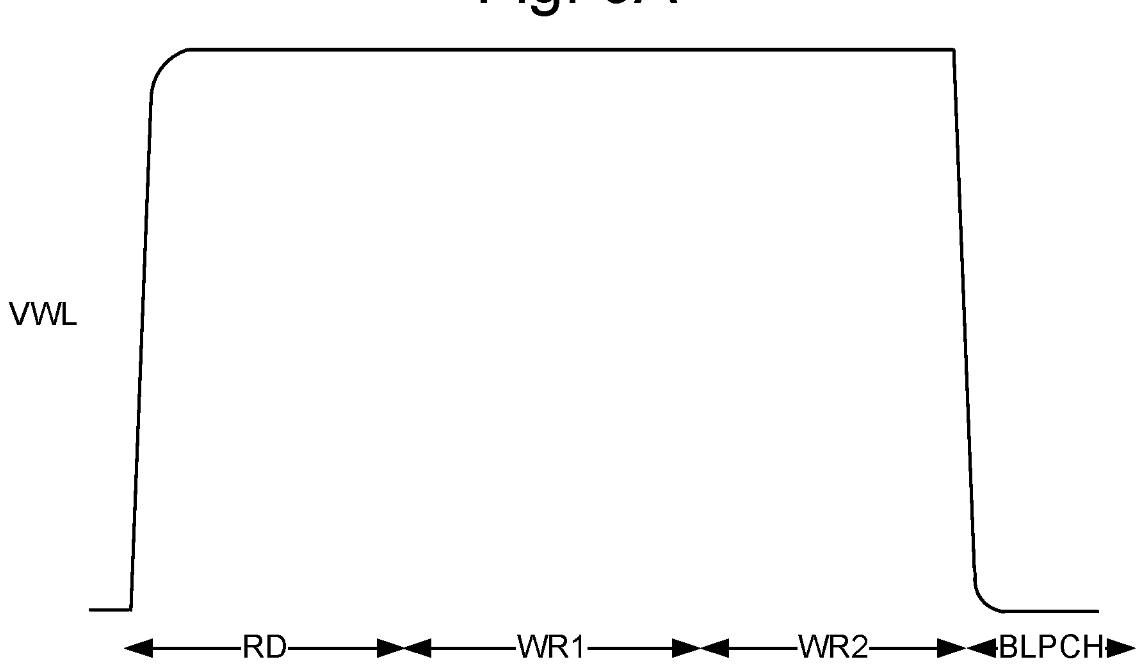
FIG. 9A depicts an example word line voltage signal in a toggle operation, in a sequence which includes a read (RD) phase, two write phases (WR1 and WR2) and a bit line pre-charge (BLPCH) phase, in accordance with various embodiments.
Figure 9B:
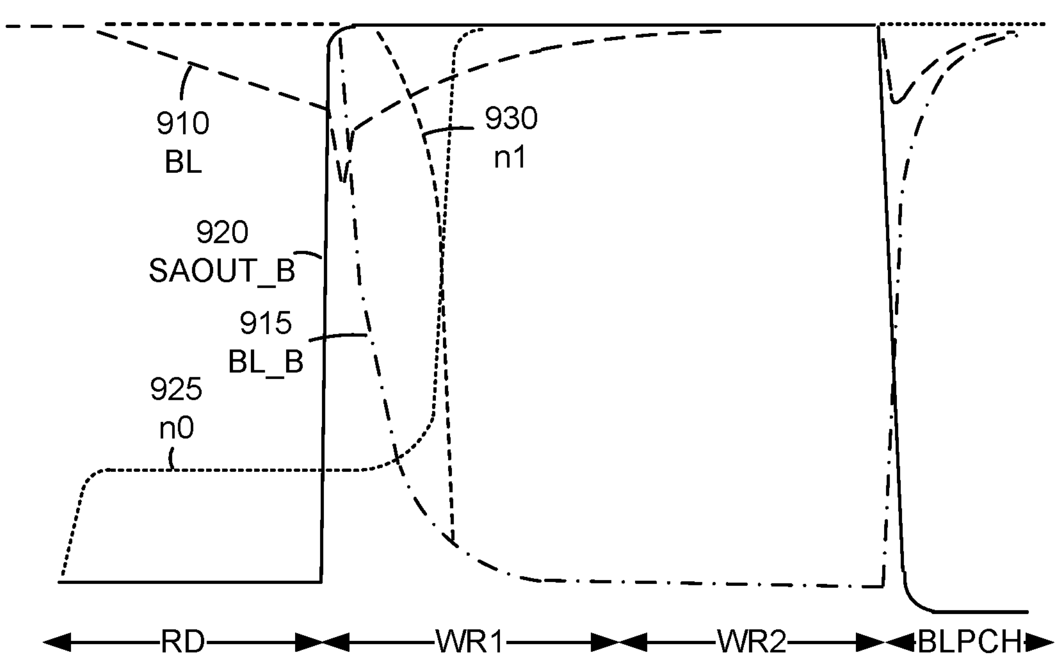
FIG. 9B depicts example voltages which develop on a primary bit line (BL), a complementary bit line (BL_B), a complementary output node of a sense amp (SAOUT_B), a first node (n0) and a second node (n1), consistent with FIG. 9A, in accordance with various embodiments.

FIG. 9A depicts an example word line voltage signal in a toggle operation, in a sequence which includes a read (RD) phase, two write phases (WR1 and WR2) and a bit line pre-charge (BLPCH) phase, in accordance with various embodiments. FIG. 9B depicts example voltages which develop on a primary bit line (BL), a complementary bit line (BL_B), a complementary output node of a sense amp (SAOUT_B), a first node (n0) and a second node (n1), consistent with FIG. 9A, in accordance with various embodiments. The plots 910, 915, 920, 925 and 930 depict the voltages of BL, BL_B, SAOUT_B, n0 and n1, respectively. These figures depict a RD-WR1-WR2 sequence for the toggle operation. The additional WR phase WR2, is used to provide more time for write completion and to overcome write contention.

Figure 10A:
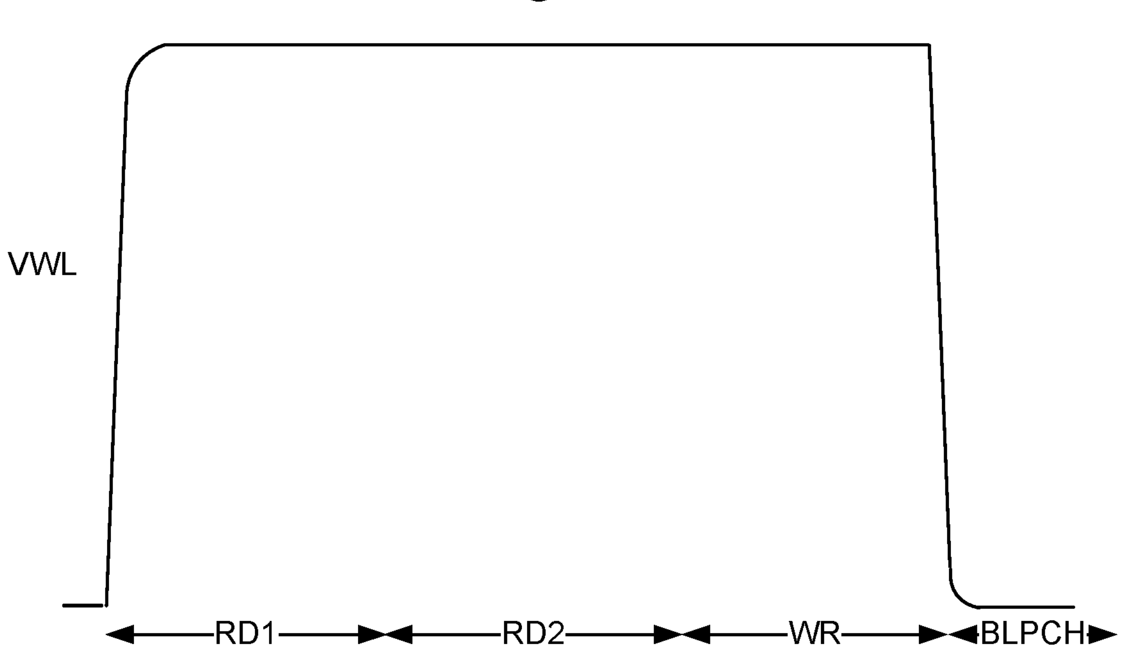
FIG. 10A depicts an example word line voltage signal in a toggle operation, in a sequence which includes two read phases (RD1 and RD2), a write phase (WR) and a bit line pre-charge (BLPCH) phase, in accordance with various embodiments.
Figure 10B:
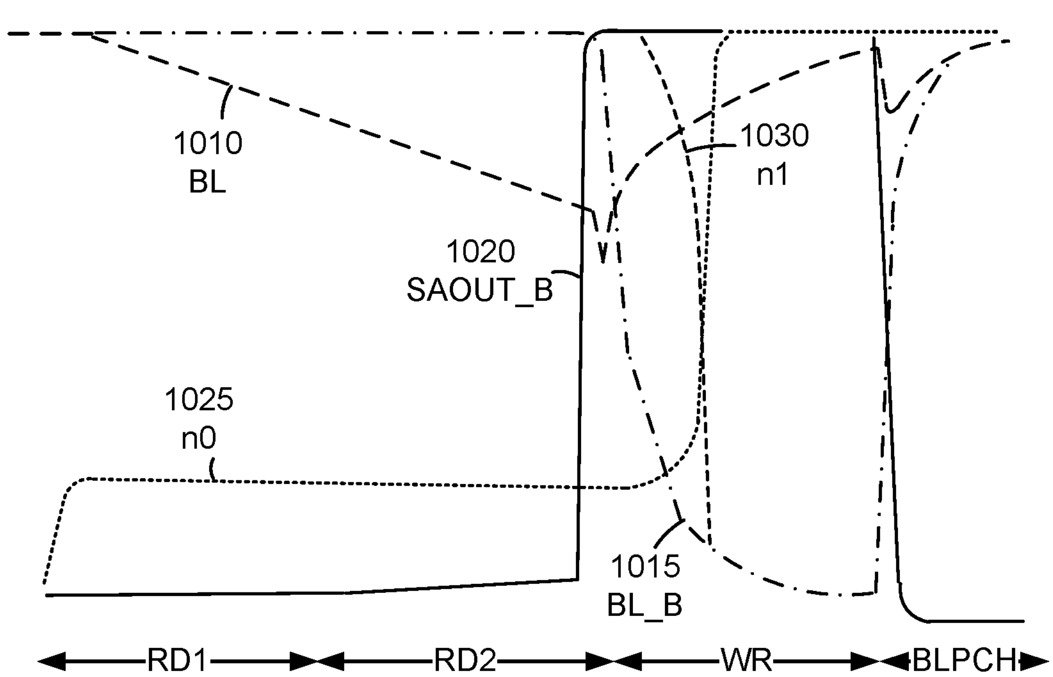
FIG. 10B depicts example voltages which develop on a primary bit line (BL), a complementary bit line (BL_B), a complementary output node of a sense amp (SAOUT_B), a first node (n0) and a second node (n1), consistent with FIG. 10A, in accordance with various embodiments.

FIG. 10A depicts an example word line voltage signal in a toggle operation, in a sequence which includes two read phases (RD1 and RD2), a write phase (WR) and a bit line pre-charge (BLPCH) phase, in accordance with various embodiments. FIG. 10B depicts example voltages which develop on a primary bit line (BL), a complementary bit line (BL_B), a complementary output node of a sense amp (SAOUT_B), a first node (n0) and a second node (n1), consistent with FIG. 10A, in accordance with various embodiments. The plots 1010, 1015, 1020, 1025 and 1030 depict the voltages of BL, BL_B, SAOUT_B, n0 and n1, respectively. These figures depict a RD-RD-WR sequence for the toggle operation. The additional RD phase allows for more differential development on the BLs.

In FIG. 9A-10B, the middle BLPCH phase is removed and the write driver pulls the BL back up and the BL_B down during the WR phase(s).

Figures 11, 12:
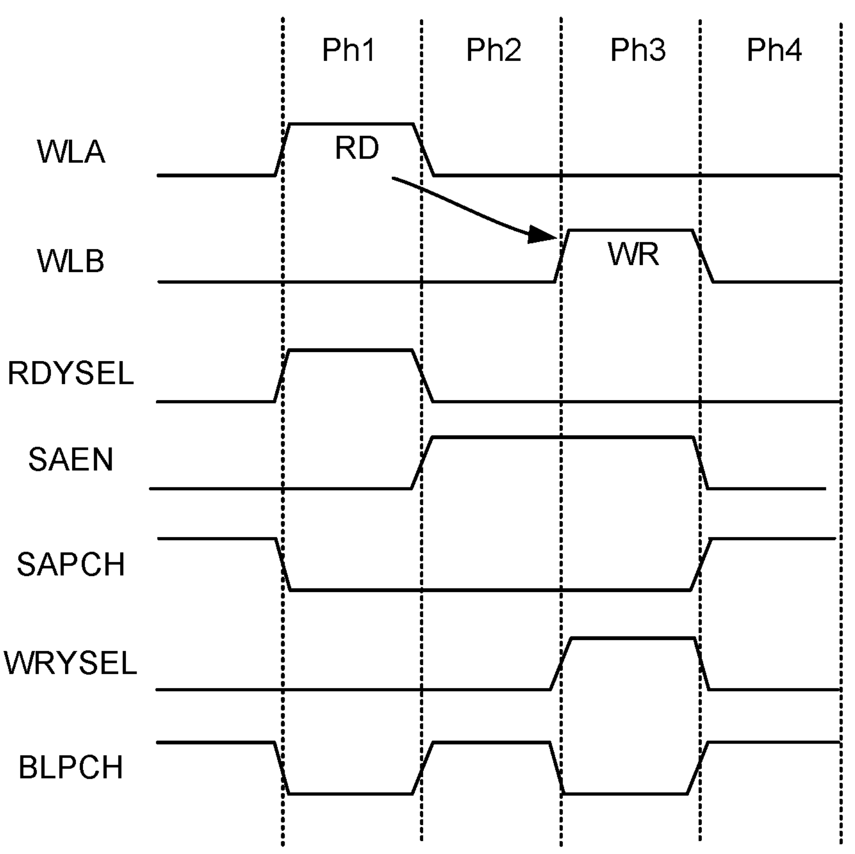
FIG. 11 depicts an example table which maps a toggle signal to an XOR function.
FIG. 12 depicts example voltage signals in a copy operation of the SRAM device of FIG. 1, from a word line WLA to a word line WLB, in accordance with various embodiments.

FIG. 11 depicts an example table which maps a toggle signal to an XOR function. Although the circuit of FIG. 2 depicts only one TOGGLE signal, there can be multiple TOGGLE signals. For example, a separate TOGGLE signal can be provided for each input/output (I/O) slice. This can refer to a set of bits such as forty bits, for example. The I/O circuitry of the SRAM device can be configured to transfer data in units of slices, in one approach. This enables individual memory cells within a given entry to be toggle independently. This bit-wise toggle operation effectively maps to an XOR function as shown in the truth table. This can be useful in various applications such as for error correction code (ECC) optimization. Additionally, the bit-wise nature of the atomic toggle operation can be applied to other use-case scenarios such as inverting all bits at once (e.g., single data vector), inverting either the upper-half most significant bits (MSB) or lower-half least significant bits (LSB) separately (i.e., upper/lower bits are two separate data vectors), and so forth.

In the table, when the TOGGLE signal=0 (indicating no toggle) and the bit=0, the toggle operation output=0 which is 0 XOR 0. Similarly, when the TOGGLE signal=0 and the bit=1, the toggle operation output=1 which is 0 XOR 1. When the TOGGLE signal=1 (indicating a toggle) and the bit=0, the toggle operation output=1 which is 1 XOR 0. When the TOGGLE signal=1 and the bit=1, the toggle operation output=0 which is 1 XOR 1.

FIG. 12 depicts example voltage signals in a copy operation of the SRAM device of FIG. 1, from a word line WLA to a word line WLB, in accordance with various embodiments. The copy operation is similar to the toggle operation in that a feedback mechanism is used to perform an atomic read-modify-write sequence. The differences are that an inversion (i.e., toggle) is not used, and the write WL is different than the read WL. In this example, the read is for a memory cell on WLA and the write operation is for a memory cell on WLB. In this manner, the contents of the memory cell on WLA are copied over to the memory cell on WLB. Corollary waveforms can also be derived for the copy operation based on FIGS. 7B,7C, and 7D. In the circuits of FIGS. 2 and 3, the copy operation is performed by setting MODIFY=1 and TOGGLE=0.

Both the toggle and copy operations can also serve as to implement other in-memory compute operations, e.g., logic operation, as described below. These operations can improve processor performance by integrating basic logic operations (e.g. INV, AND, OR, NAND, NOR) inside the SRAM itself without the use of a separate execution unit. Processor architectures can take advantage of this feature to improve performance with potential applications in tracker, queue, and pointer logic. Moreover, the logic operations can be reconfigured on a per-cycle and even per-bit basis. This is in contrast to SRAM devices which are configured purely for storing data, while logic operations are performed outside the devices and where the circuits for performing the logic operations are static, e.g., having separate gates for each function, and not reconfigurable. The technique describes an SRAM with an atomic read-modify-write operation where the modify portion is a reconfigurable function.

Figure 13A:
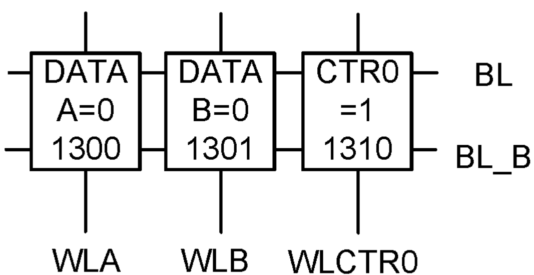
FIG. 13A depicts a column of memory cells in an A or B logic operation consistent with the process of FIG. 5, including a first data memory cell 1300 with data A=0, a second data memory cell 1301 with data B=0 and a first control memory cell 1310 with data CTR0=1.

FIG. 13A depicts a column of memory cells in an A or B logic operation consistent with the process of FIG. 5, including a first data memory cell 1300 with data A=0, a second data memory cell 1301 with data B=0 and a first control memory cell 1310 with data CTR0=1. The memory cells are in a common column and connected to a pair of bit lines BL and BL_B. The memory cells 1300 and 1301 are referred to as data memory cells since they contain data (e.g., one bit in each cell) which is to be operated on by a logic operation. The memory cell 1310 is referred to as a control memory cell because it is configured to bias or control a read result of the data memory cells to achieve a specified logic operation for the data memory cells.

The data memory cells are connected to respective data word lines WLA and WLB and the control memory cell is connected to a respective control word line WLCTR0. Further, the data memory cells 1300 and 1301 comprise DATA A=0 and DATA B=0, while the control memory cell 1310 comprises control data CTR0=1. The word lines are concurrently activated to access the memory cells simultaneously while the control bit helps to bias the bit line differential. This results in the sense amp evaluating to the correct output for a desired logic operation. In particular, the OR function is simulated by pre-setting CTR0=1, e.g., writing a 1 bit to the control memory cell 1310. Since the sense amp (e.g., as depicted in FIGS. 2 and 3) resolves in the majority direction of all inputs (i.e., DATA A, DATA B and CTR0), the result of the A OR B function is realized at SAOUT. The result of the operation (A OR B=0) can then be written back into the SRAM, in one approach using the WRDATA/WRDATA_B data paths and by setting MODIFY=1.

Activating multiple word lines concurrently is different than a typical approach which activates a single word line at a time in a read or write operation. Generally, multiple WLs can be activated concurrently to realize functions for two or more inputs. Moreover, one or more control WLs can be introduced to reconfigure the function of the inputs on the fly as needed.

Figure 13B:
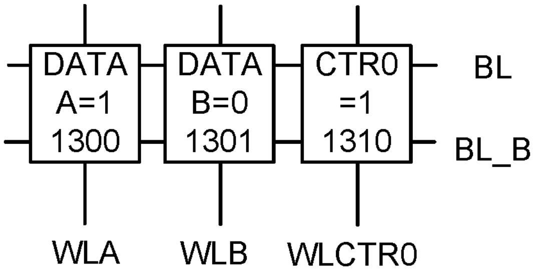
FIG. 13B depicts a column of memory cells in an A or B logic operation consistent with the process of FIG. 5, including a first data memory cell 1300 with data A=1, a second data memory cell 1301 with data B=0 and a first control memory cell 1310 with data CTR0=1.

FIG. 13B depicts a column of memory cells in an A or B logic operation consistent with the process of FIG. 5, including a first data memory cell 1300 with data A=1, a second data memory cell 1301 with data B=0 and a first control memory cell 1310 with data CTR0=1. In this case, DATA A=1 instead of 0, so that the result of the operation is A OR B=1.

Figure 14A:
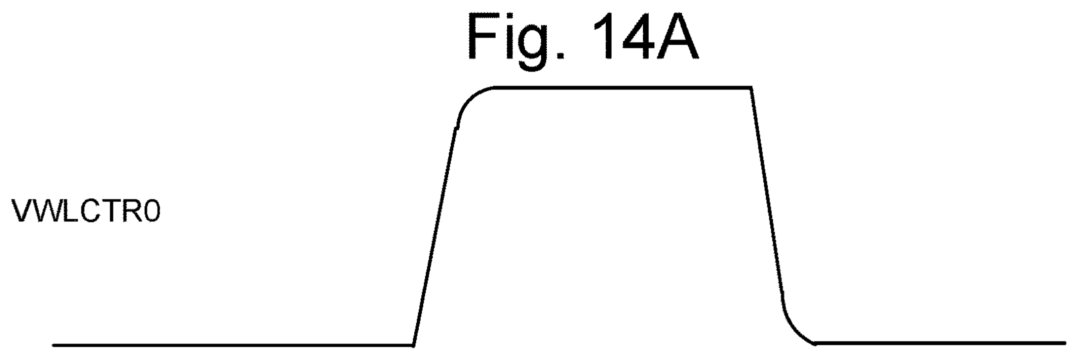
FIG. 14A depicts an example voltage signal for WLCTR0 in the A or B logic operation of FIG. 13A or 13B, in accordance with various embodiments.

FIG. 14A depicts an example voltage signal for WLCTR0 in the A or B logic operation of FIG. 13A or 13B, in accordance with various embodiments. The voltage signal is represented by the voltage VWLCTR0.

Figure 14B:
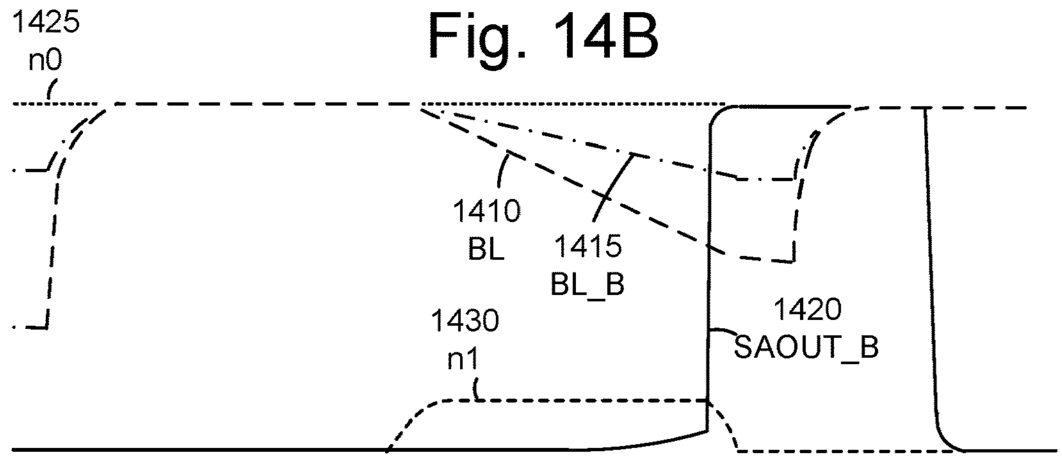
FIG. 14B depicts example voltages which develop on a primary bit line (BL), a complementary bit line (BL_B), a complementary output node of a sense amp (SAOUT_B), and a first node (n0) and a second node (n1) of a control memory cell CTR0, consistent with FIGS. 13A and 14A, when A=0 and B=0, in accordance with various embodiments.

FIG. 14B depicts example voltages which develop on a primary bit line (BL), a complementary bit line (BL_B), a complementary output node of a sense amp (SAOUT_B), and a first node (n0) and a second node (n1) of a control memory cell CTR0, consistent with FIGS. 13A and 14A, when A=0 and B=0, in accordance with various embodiments. The plots 1410, 1415, 1420, 1425 and 1430 depict the voltages of BL, BL_B, SAOUT_B, n0 and n1, respectively. In this example, when VWLCTR0 is pulled high, the bit line voltages BL and BL_B decrease, where BL<BL_B. Also, n1 increases slightly while n0 remains at a higher level. Once the bit line voltage difference is sufficiently developed, SAOUT_B goes high, representing a 1 bit, so that the result of the logic operation is SAOUT=0. This agrees with 0 OR 0=0. Essentially, with two memory cells=0 and one memory cell=1, the output of the bit 0 prevails.

Figure 14C:
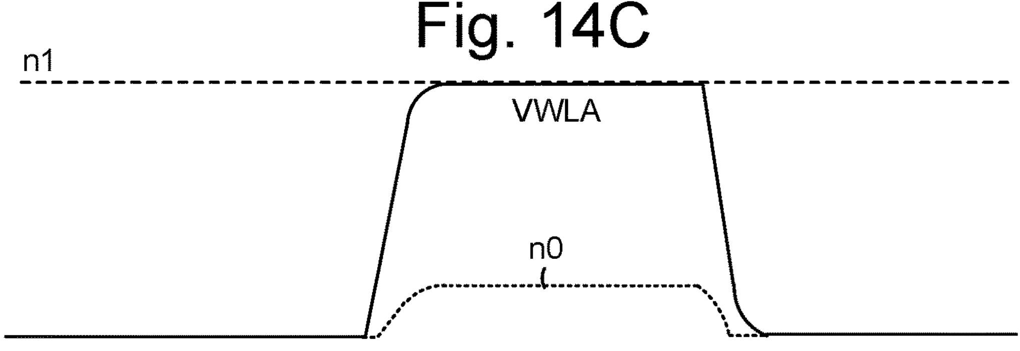
FIG. 14C depicts example voltage signals WLA and n0 for the first data memory cell, consistent with FIG. 14B, in accordance with various embodiments.

FIG. 14C depicts example voltage signals WLA and n0 for the first data memory cell, consistent with FIG. 14B, in accordance with various embodiments. VWLA is pulled high at the same time as VWLCTR0. Also, n0 increases slightly while n1 remains at a higher level.

Figure 14D:
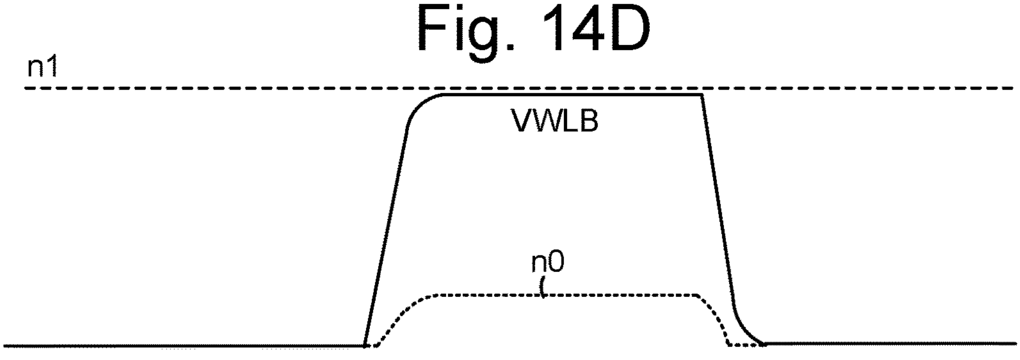
FIG. 14D depicts example voltage signals WLB and n0 for the second data memory cell, consistent with FIG. 14B, in accordance with various embodiments.

FIG. 14D depicts example voltage signals WLB and n0 for the second data memory cell, consistent with FIG. 14B, in accordance with various embodiments. VWLB is pulled high at the same time as VWLA and VWLCTR0. Also, n0 increases slightly while n1 remains at a higher level.

Figure 14E:
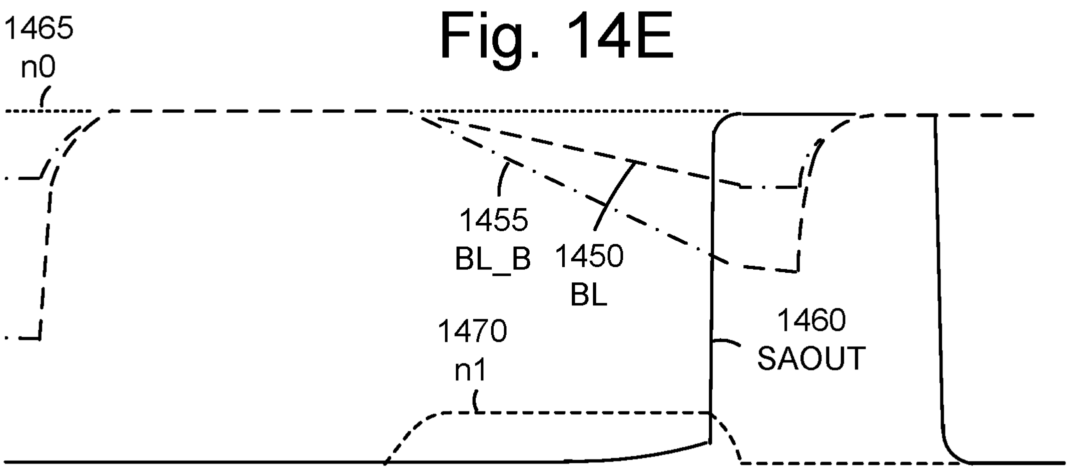
FIG. 14E depicts example voltages which develop on a primary bit line (BL), a complementary bit line (BL_B), a primary output node of a sense amp (SAOUT), and a first node (n0) and a second node (n1) of a control memory cell CTR0, consistent with FIGS. 13B and 14A, when A=1 and B=0, in accordance with various embodiments.

FIG. 14E depicts example voltages which develop on a primary bit line (BL), a complementary bit line (BL_B), a primary output node of a sense amp (SAOUT), and a first node (n0) and a second node (n1) of a control memory cell CTR0, consistent with FIG. 13B and FIG. 14A, when A=1 and B=0, in accordance with various embodiments. The difference from FIG. 14B is that A=1 instead of A=0. VWLCTR0 is the same as in FIG. 14A. The plots 1450, 1455, 1460, 1465 and 1470 depict the voltages of BL, BL_B, SAOUT, n0 and n1, respectively. In this example, when VWLCTR0 is pulled high, the bit line voltages BL and BL_B decrease, where BL>BL_B. Also, n1 increases slightly while n0 remains at a higher level. Once the bit line voltage difference is sufficiently developed, SAOUT goes high, representing a 1 bit, so that the result of the logic operation is SAOUT=1. This agrees with 1 OR 0=1. Essentially, with two memory cells=1 and one memory cell=0, the output of the bit 1 prevails.

Figure 14F:
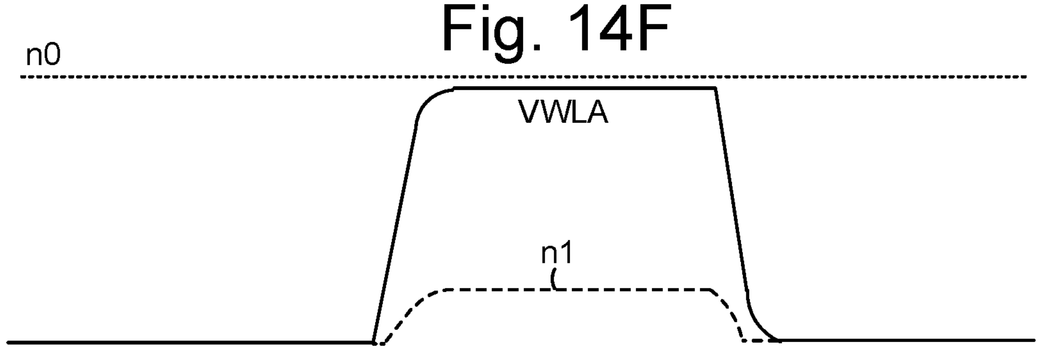
FIG. 14F depicts example voltage signals WLA and n1 for the first data memory cell, consistent with FIG. 14E, in accordance with various embodiments.

FIG. 14F depicts example voltage signals WLA and n1 for the first data memory cell, consistent with FIG. 14E, in accordance with various embodiments. VWLA is pulled high at the same time as VWLCTR0. Also, n1 increases slightly while n0 remains at a higher level.

Figure 14G:
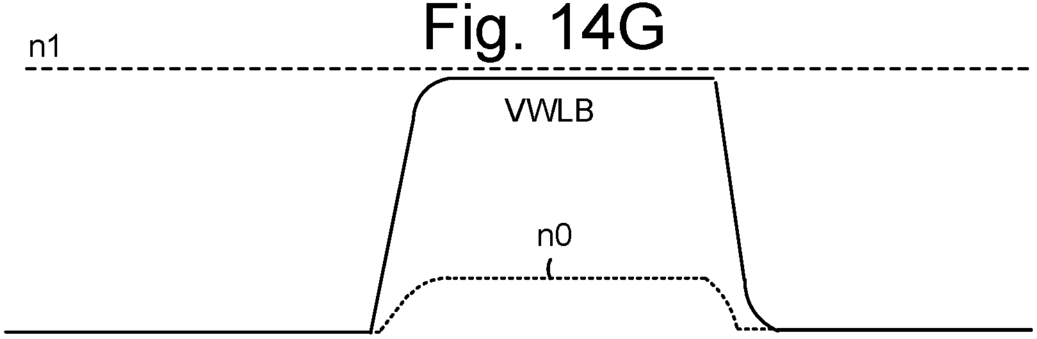
FIG. 14G depicts example voltage signals WLB and n0 for the second data memory cell, consistent with FIG. 14E, in accordance with various embodiments.

FIG. 14G depicts example voltage signals WLB and n0 for the second data memory cell, consistent with FIG. 14E, in accordance with various embodiments. VWLB is pulled high at the same time as VWLA and VWLCTR0. Also, n0 increases slightly while n1 remains at a higher level.

Figure 15A:
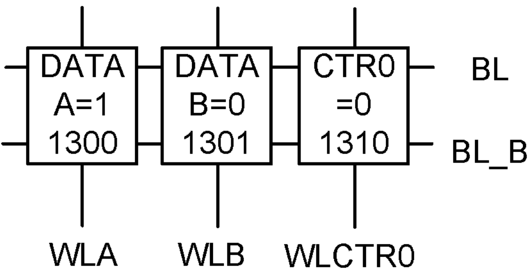
FIG. 15A depicts a column of memory cells in an A AND B logic operation consistent with the process of FIG. 5, including a first data memory cell 1300 with data A=1, a second data memory cell 1301 with data B=0 and a first control memory cell 1310 with data CTR0=0.

FIG. 15A depicts a column of memory cells in an A AND B logic operation consistent with the process of FIG. 5, including a first data memory cell 1300 with data A=1, a second data memory cell 1301 with data B=0 and a first control memory cell 1310 with data CTR0=0.

By pre-setting CTR0=0 in the control memory cell 1310, an AND function is implemented. The memory cells are in a common column and connected to a pair of bit lines BL and BL_B. The data memory cells 1300 and 1301 comprise DATA A=1 and DATA B=0, while the control memory cell 1310 comprises control data CTR0=0. The result of the operation (A AND B=0) can be written back into the SRAM, in one approach.

Figure 15B:
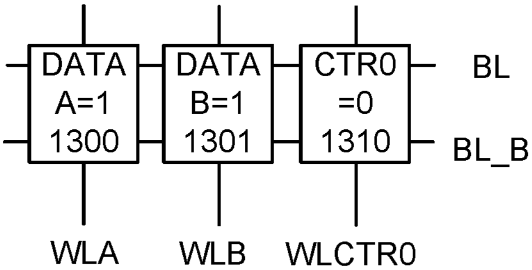
FIG. 15B depicts a column of memory cells in an A AND B logic operation consistent with the process of FIG. 5, including a first data memory cell 1300 with data A=1, a second data memory cell 1301 with data B=1 and a first control memory cell 1310 with data CTR0=0.

FIG. 15B depicts a column of memory cells in an A AND B logic operation consistent with the process of FIG. 5, including a first data memory cell 1300 with data A=1, a second data memory cell 1301 with data B=1 and a first control memory cell 1310 with data CTR0=0. B=1 instead of B=0 as in FIG. 15A. In another option, the reconfigurability of the logic operation (OR, AND) can also be achieved by biasing the sense amp either by using separate reference voltages or offsetting the effective sizing on one side of the sense amp. This option can be separate from, or combined with, the use of control memory cells.

Figure 16A:
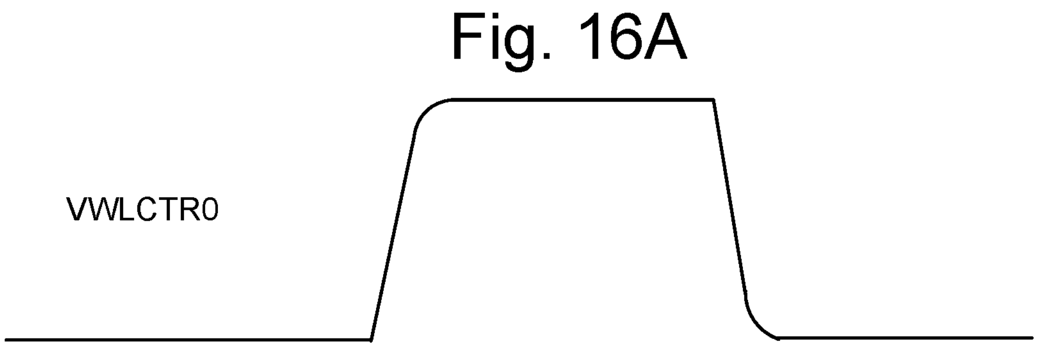
FIG. 16A depicts an example voltage signal for WLCTR0 in the A AND B logic operation of FIG. 15A or 15B, in accordance with various embodiments.
Figure 16B:
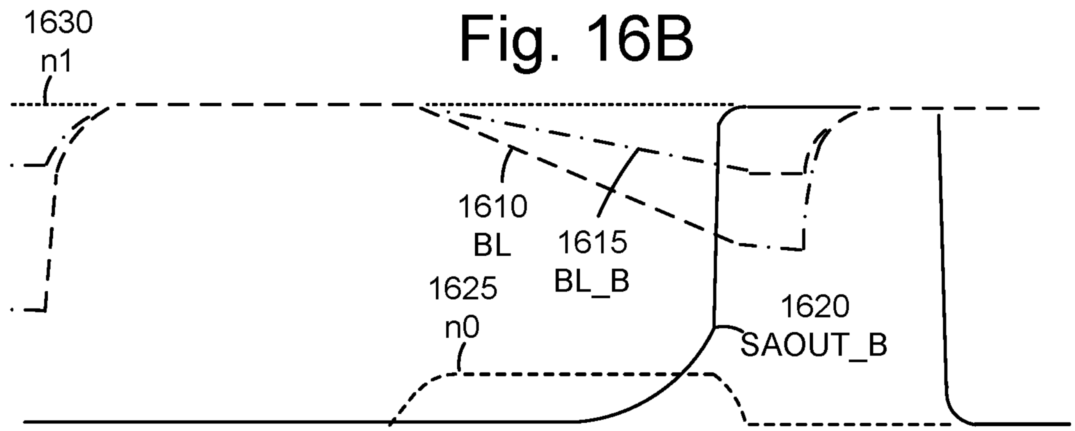
FIG. 16B depicts example voltages which develop on a primary bit line (BL), a complementary bit line (BL_B), a complementary output node of a sense amp (SAOUT_B), and a first node (n0) and a second node (n1) of a control memory cell CTR0, consistent with FIGS. 15A and 16A, where A=1 and B=0, in accordance with various embodiments.

FIG. 16A depicts an example voltage signal for WLCTR0 in the A AND B logic operation of FIG. 15A or 15B, in accordance with various embodiments. The voltage signal is represented by the voltage VWLCTR0. FIG. 16B depicts example voltages which develop on a primary bit line (BL), a complementary bit line (BL_B), a complementary output node of a sense amp (SAOUT_B), and a first node (n0) and a second node (n1) of a control memory cell CTR0, consistent with FIG. 16A, where A=1 and B=0, in accordance with various embodiments. The plots 1610, 1615, 1620, 1625 and 1630 depict the voltages of BL, BL_B, SAOUT_B, n0 and n1, respectively. In this example, when VWLCTR0 is pulled high, the bit line voltages BL and BL_B decrease, where BL<BL_B. Also, n0 increases slightly while n1 remains at a higher level. Once the bit line voltage difference is sufficiently developed, SAOUT_B goes high, representing a 1 bit, so that the result of the logic operation is SAOUT=0. This agrees with 1 AND 0=0. Essentially, with two memory cells=0 and one memory cell=1, the output of the bit 0 prevails.

Figure 16C:
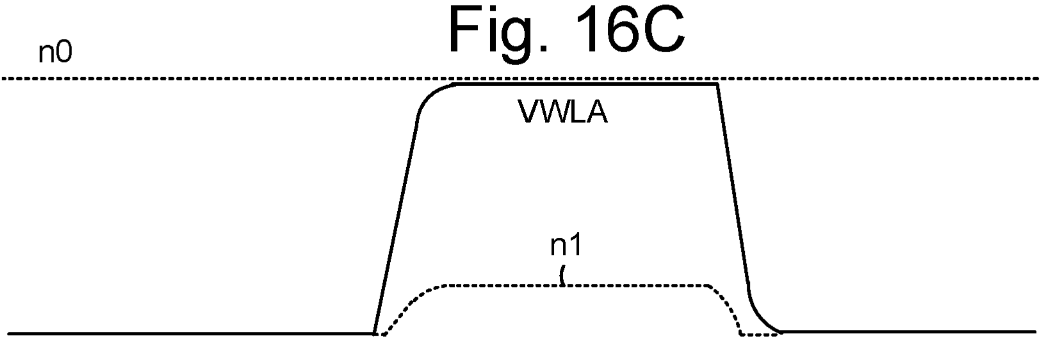
FIG. 16C depicts example voltage signals WLA and n1 for the first data memory cell, consistent with FIG. 16B, in accordance with various embodiments.

FIG. 16C depicts example voltage signals WLA and n1 for the first data memory cell, consistent with FIG. 16B, in accordance with various embodiments. VWLA is pulled high at the same time as VWLCTR0. Also, n1 increases slightly while n0 remains at a higher level.

Figure 16D:
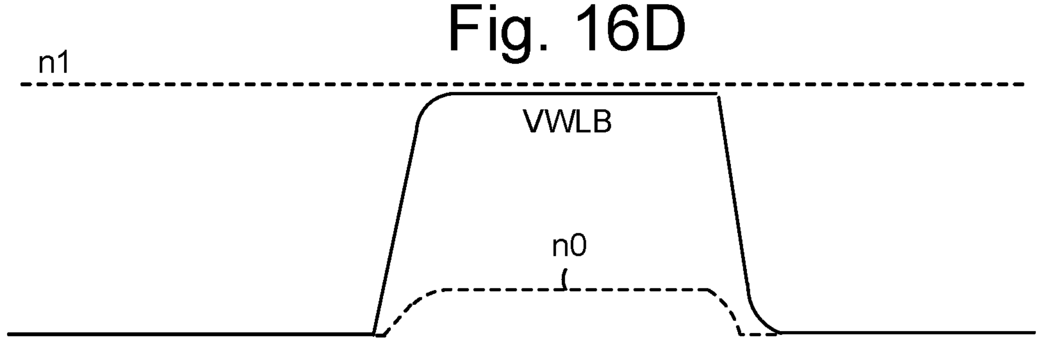
FIG. 16D depicts example voltage signals WLB and n0 for the second data memory cell, consistent with FIG. 16B, in accordance with various embodiments.

FIG. 16D depicts example voltage signals WLB and n0 for the second data memory cell, consistent with FIG. 16B, in accordance with various embodiments. VWLB is pulled high at the same time as VWLA and VWLCTR0. Also, n0 increases slightly while n1 remains at a higher level.

Figure 16E:
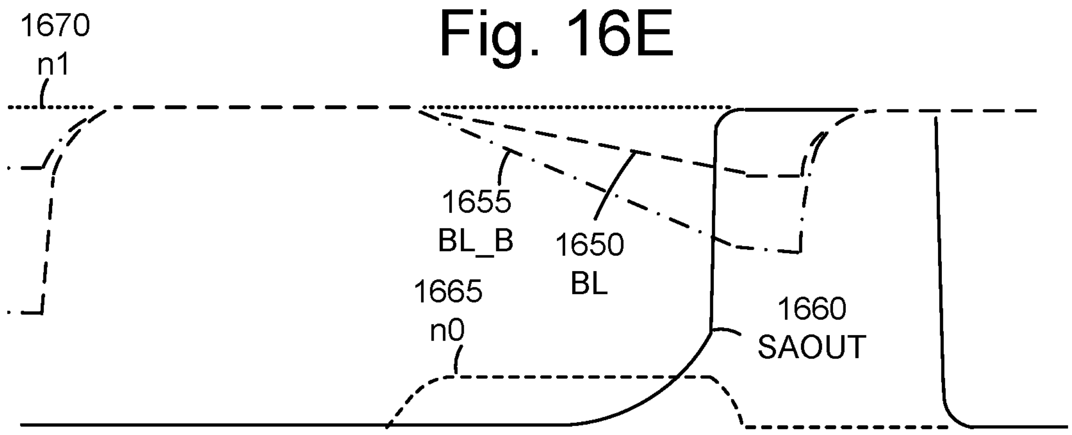
FIG. 16E depicts example voltages which develop on a primary bit line (BL), a complementary bit line (BL_B), a primary output node of a sense amp (SAOUT), and a first node (n0) and a second node (n1) of a control memory cell CTR0, consistent with FIGS. 15B and 16A, when A=1 and B=1, in accordance with various embodiments.

FIG. 16E depicts example voltages which develop on a primary bit line (BL), a complementary bit line (BL_B), a primary output node of a sense amp (SAOUT), and a first node (n0) and a second node (n1) of a control memory cell CTR0, consistent with FIGS. 15B and 16A, when A=1 and B=1, in accordance with various embodiments. The difference from FIG. 16B is that B=1 instead of B=0. VWLCTR0 is the same as in FIG. 16A. The plots 1650, 1655, 1660, 1665 and 1670 depict the voltages of BL, BL_B, SAOUT, n0 and n1, respectively. In this example, when VWLCTR0 is pulled high, the bit line voltages BL and BL_B decrease, where BL>BL_B. Also, n0 increases slightly while n1 remains at a higher level. Once the bit line voltage difference is sufficiently developed, SAOUT goes high, representing a 1 bit, so that the result of the logic operation is SAOUT=1. This agrees with 1 AND 1=1. Essentially, with two memory cells=1 and one memory cell=0, the output of the bit 1 prevails.

Figure 16F:
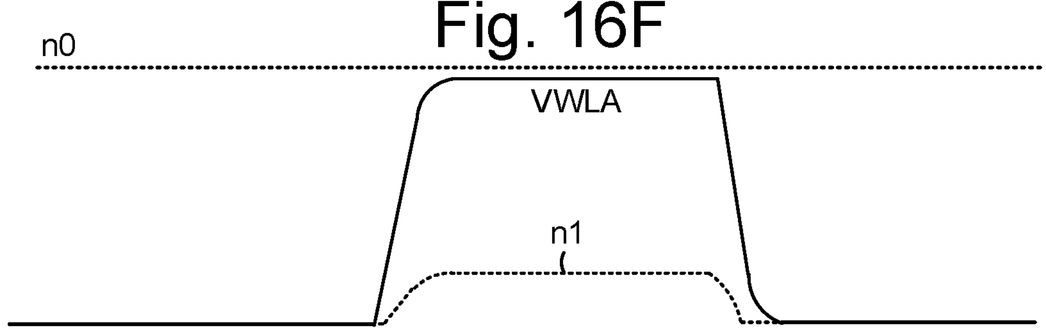
FIG. 16F depicts example voltage signals WLA and n1 for the first data memory cell, consistent with FIG. 16E, in accordance with various embodiments.

FIG. 16F depicts example voltage signals WLA and n1 for the first data memory cell, consistent with FIG. 16E, in accordance with various embodiments. VWLA is pulled high at the same time as VWLCTR0. Also, n1 increases slightly while n0 remains at a higher level.

Figure 16G:
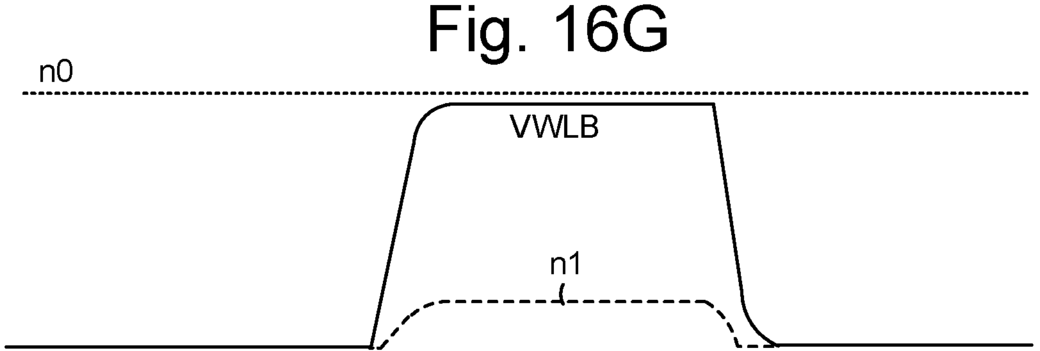
FIG. 16G depicts example voltage signals WLB and n1 for the second data memory cell, consistent with FIG. 16E, in accordance with various embodiments.

FIG. 16G depicts example voltage signals WLB and n1 for the second data memory cell, consistent with FIG. 16E, in accordance with various embodiments. VWLB is pulled high at the same time as VWLA and VWLCTR0. Also, n1 increases slightly while n0 remains at a higher level.

FIG. 17 depicts an example table of logic operations that can be implemented for two data memory cells having bit values A and B, consistent with FIG. 13A to 16G, in accordance with various embodiments. The examples above involve a logic operation for two data memory cells, e.g., A OR B and A AND B which correspond to the Boolean expressions A+B and AB, respectively. As discussed, the A OR B operation is achieved by setting CTR0=1 and the A AND B operation is achieved by setting CTR0=0.

FIG. 18A depicts an example table of logic operations that can be implemented for three data memory cells having bit values A, B and C, consistent with FIGS. 19A and 19B, in accordance with various embodiments. However, the techniques can be expanded to three or more data memory cells. The table depicts three possible logic operations that can be implemented for three bits: A, B and C. A first operation is A OR B OR C, also written as the Boolean expression A+B+C. A second operation is a majority function (e.g., 2 out of 3). The associated truth table is depicted in FIG. 18B. A third operation is A AND B AND C, also written as the Boolean expression ABC. The threshold is the number of primary data cells which must =1 in order for the output to be 1. CTR0 is the bit of the first control memory cell and CTR1 is the bit of the second control memory cell. A second control WL is coupled to the second memory cell. The technique can be generalized to implement any threshold function of N inputs (i.e., a T out of N threshold function).

In this example, for the OR operation, CTR0=1 and CTR1=1 and the threshold=1. For the majority operation, CTR0=1 and CTR1=0 and the threshold=2. For the AND operation, CTR0=0 and CTR1=0 and the threshold=3.

FIG. 18B depicts an example truth table for the majority function of FIG. 18A. As mentioned, the output is 1 if the majority of the data bits are 1. Thus, with three data bits, the output is 1 if 2 or 3 of the data bits are 1. The output is 0 if 0 or 1 of the data bits are 1.

FIG. 19A depicts a column of memory cells in a majority (A, B, C) logic operation consistent with the process of FIG. 5, and with the tables of FIGS. 18A and 18B, including a first data memory cell 1300 with data A=1, a second data memory cell 1301 with data B=0, a third data memory cell 1302 with data C=0, a first control memory cell 1310 with data CTR0=1, and a second control memory cell 1311 with data CTR1=0. The third data memory cell 1302 is coupled to a third data word line WLC, and the second control memory cell is coupled to a second control word line WLCTR1. In this example, the result of the logic operation is 0 since only 1 of 3 data bits=1, e.g., a minority of the data bits=1. The logic operation can be implemented using voltage signals similar to those discussed previously.

FIG. 19B depicts a column of memory cells in a majority (A, B, C) logic operation consistent with the process of FIG. 5, including a first data memory cell 1300 with data A=1, a second data memory cell 1301 with data B=1, a third data memory cell 1302 with data C=0, a first control memory cell 1310 with data CTR0=1, and a second control memory cell 1311 with data CTR1=0. In this example, the result of the logic operation is 1 since 2 of 3 data bits=1, e.g., a majority of the data bits=1. The logic operation can be implemented using voltage signals similar to those discussed previously.

FIG. 20 depicts an example table of logic operations AND-OR and OR-AND for three data memory cells A, B and C, in accordance with various embodiments. Other logic operations or functions can be achieved by building on operations previously described. For example, the TOGGLE signal can enable NOR, NAND, and minority functions. Additionally, complex functions such as AND-OR and OR-AND are possible when applying weighted inputs. In this scenario, each input is assigned a weight. And, if a certain number of weighted inputs are "1" to reach the threshold, then the output will be "1". The weights and thresholds implement AND-OR and OR-AND functions in this example. To provide a 2× weight on an input, a memory cell which is twice the size of the other memory cells could be used. But, this may not be practical since all memory cells are generally the same size in an SRAM. Instead, the value from one data memory cell can be duplicated to another data memory cell in the same column to double the weight. This can be done by using the copy operation, as discussed previously.

In the table, the logic operation AND-OR, represented by the Boolean expression AB+C, uses weights WA=1, WB=1 and WC=2 for the A, B and C bits, respectively, in the first, second and third data memory cells, respectively. The threshold is 2, indicating that at least two of the bits must =1 in order for the output=1. Additionally, the three control bits are CTR0=1, CTR1=1 and CTR2=0.

The logic operation OR-AND, represented by the Boolean expression (A+B)C, also uses weights WA=1, WB=1 and WC=2 for the A, B and C bits, respectively, in the first, second and third data memory cells, respectively. The threshold is 3, indicating that at least three of the bits must =1 in order for the output=1. Additionally, the three control bits are CTR0=1, CTR1=0 and CTR2=0.

Figures 21, 22:
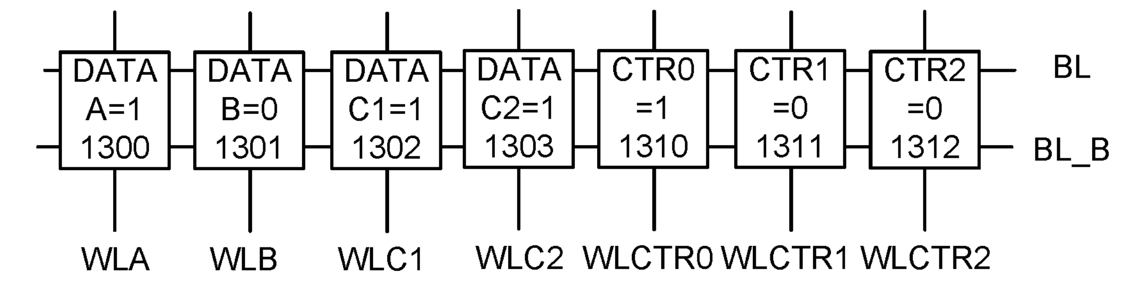
FIG. 21 depicts an example column of memory cells consistent with the (A+B)C logic operation of FIG. 20, including a first data memory cell 1300 with data A=1, a second data memory cell 1301 with data B=0, a third data memory cell 1302 with data C1=1, a fourth data memory cell 1303 with data C2=1, as a copy of C1, a first control memory cell 1310 with data CTR0=1, a second control memory cell 1311 with data CTR1=0 and a third control memory cell 1312 with data CTR2=0.
FIG. 22 depicts an example table of complex logic operations for three data memory cells A, B and C, in accordance with various embodiments.

FIG. 21 depicts an example column of memory cells consistent with the (A+B)C logic operation of FIG. 20, including a first data memory cell 1300 with data A=1, a second data memory cell 1301 with data B=0, a third data memory cell 1302 with data C1=1, a fourth data memory cell 1303 with data C2=1, as a copy of C1, a first control memory cell 1310 with data CTR0=1, a second control memory cell 1311 with data CTR1=0 and a third control memory cell 1312 with data CTR2=0. The third and fourth data memory cells 1302 and 1303, respectively, are coupled to data word lines WLC1 and WLC2, respectively. In this example, the result of the logic operation is 1 since 3 of 4 data bits=1, which meets the threshold of 3 in FIG. 20. The logic operation can be implemented using voltage signals similar to those discussed previously.

To execute the complex functions of FIG. 20, four data memory cells and three control memory cells are used. Note that the write back of the result of the logic operation can be to one of the data or control memory cells involved in the operation, or to another memory cell in the column on a different WL, as desired.

As mentioned, a copy operation can be performed to read the bit C1 of the third data memory cell and write it as the bit C2 of the fourth data memory cell to double the weight of the bit before activating the bit lines and performing the sensing.

In an example implementation, the sense amplifier is coupled to first, second, third and fourth data memory cells 1300, 1301, 1302 and 1303, respectively, and to first, second and third control memory cells 1310, 1311 and 1312, respectively, in a common column. Additionally, first, second, third and fourth data word lines WLA, WLB, WLC1 and WLC2, respectively, are coupled to the first, second, third and fourth data memory cells 1300, 1301, 1302 and 1303, respectively. To perform a logic operation, the control circuit is to copy a bit from the third data memory cell to the fourth data memory cell, and concurrently activate the first, second, third and fourth data word lines, and the first, second and third control word lines.

In a further example, to perform an AND-OR logic operation, the control circuit is to write a 1 bit to the first and second control memory cells and a 0 bit to the third control memory cell; and the logic operation comprises (A AND B) OR C, where A and B are bits in the first and second data memory cells, respectively, and C is the bit in the third and fourth data memory cells.

In a further example, to perform an OR-AND logic operation, the control circuit is to write a 1 bit to the first control memory cell and a 0 bit to the second and third control memory cells; and the logic operation comprises (A OR B) AND C, where A and B are bits in the first and second data memory cells, respectively, C is a bit in the third and fourth data memory cells.

FIG. 22 depicts an example table of complex logic operations for three data memory cells A, B and C, in accordance with various embodiments. By applying different settings for the TOGGLE, CTRL, and input weights, a full set of logic operations can be provided. This includes threshold, complex, and complementary logic. Moreover, by changing these settings on a cycle-by-cycle basis, the logic operations can be reconfigured as desired.

The OR logic operation, represented by A+B+C, uses TOGGLE=0, WA=1, WB=1, WC=1, CTR0=1, CTR1=1 and CTR2=NA (not applicable).

The majority logic operation, represented by AB+AC+BC, uses TOGGLE=0, WA=1, WB=1, WC=1, CTR0=1, CTR1=0 and CTR2=NA (not applicable).

The AND logic operation, represented by ABC, uses TOGGLE=0, WA=1, WB=1, WC=1, CTR0=0, CTR1=0 and CTR2=NA.

The AND-OR logic operation, represented by AB+C, uses TOGGLE=0, WA=1, WB=1, WC=2, CTR0=1, CTR1=1 and CTR2=0.

The OR-AND logic operation, represented by (A+B)C, uses TOGGLE=0, WA=1, WB=1, WC=2, CTR0=1, CTR1=0 and CTR2=0.

The NOR logic operation, represented by !(A+B+C), where "!" denotes inverse, uses TOGGLE=1, WA=1, WB=1, WC=1, CTR0=1, CTR1=1 and CTR2=NA.

The minority logic operation, represented by !(AB+AC+BC), where "!" denotes inverse, uses TOGGLE=1, WA=1, WB=1, WC=1, CTR0=1, CTR1=0 and CTR2=NA.

The NAND logic operation, represented by !(ABC), where "!" denotes inverse, uses TOGGLE=1, WA=1, WB=1, WC=1, CTR0=0, CTR1=0 and CTR2=NA.

The inverse AND-OR logic operation, e.g., AND-OR-INVERT or NOT (AND-OR), represented by !(AB+C), where "!" denotes inverse, uses TOGGLE=1, WA=1, WB=1, WC=2, CTR0=1, CTR1=1 and CTR2=0.

The inverse OR-AND logic operation, e.g., OR-AND-INVERT or NOT (OR-AND), represented by !(A+B)C, where "!" denotes inverse, uses TOGGLE=1, WA=1, WB=1, WC=2, CTR0=1, CTR1=0 and CTR2=0.

In these examples, the settings for OR, majority, AND, AND-OR and OR-AND are the same as for the counterpart inverse operations of NOR, minority, NAND, inverse AND-OR and inverse OR-AND, respectively, except for the value of TOGGLE.

Figure 23:
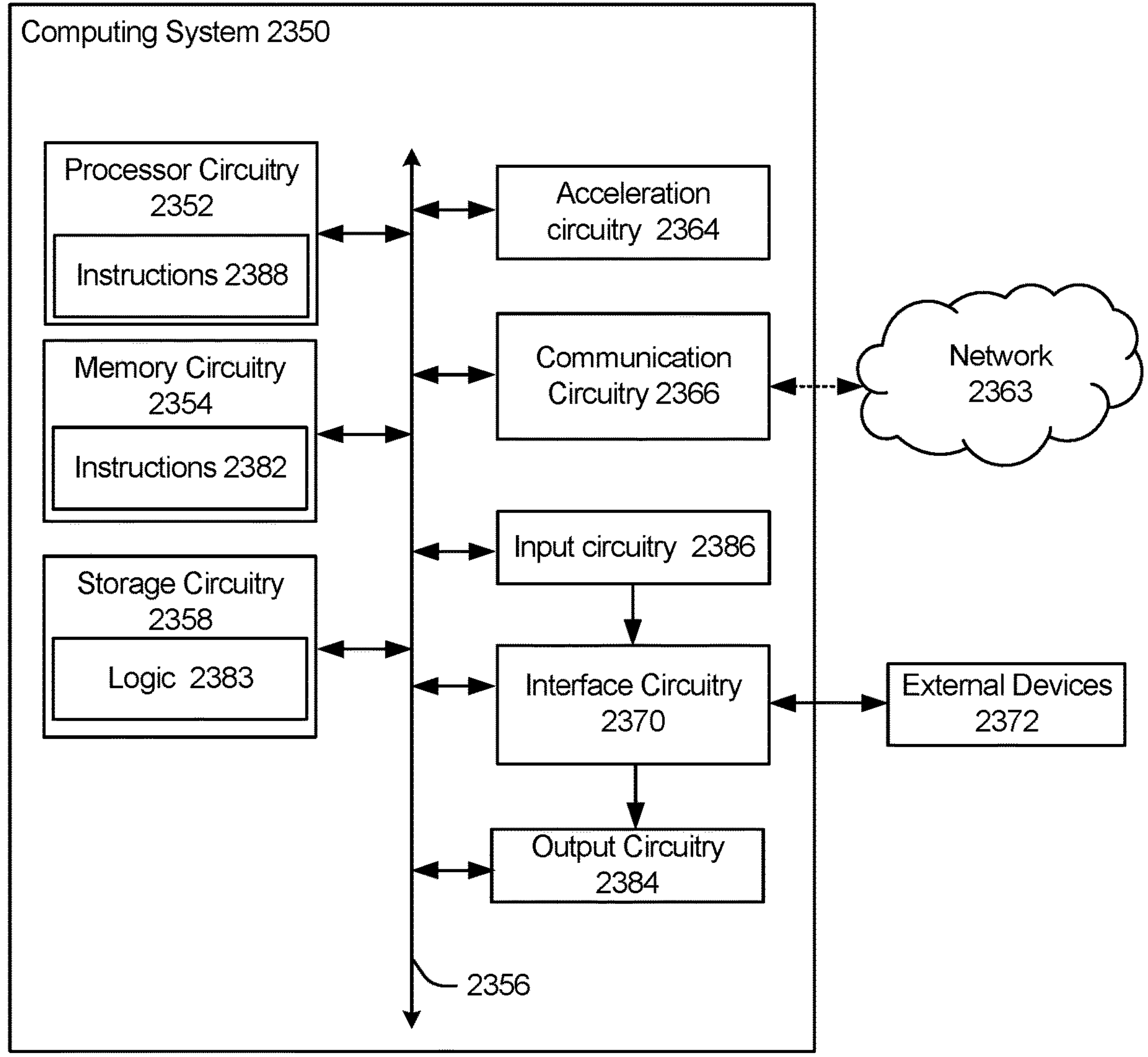
FIG. 23 illustrates an example of components that may be present in a computing system 2350 for implementing the techniques (e.g., operations, processes, methods, and methodologies) described herein.

FIG. 23 illustrates an example of components that may be present in a computing system 2350 for implementing the techniques (e.g., operations, processes, methods, and methodologies) described herein. The computing system 2350 may include any combinations of the hardware or logical components referenced herein. The components may be implemented as ICs, portions thereof, discrete electronic devices, or other modules, instruction sets, programmable logic or algorithms, hardware, hardware accelerators, software, firmware, or a combination thereof adapted in the computing system 2350, or as components otherwise incorporated within a chassis of a larger system. For one embodiment, at least one processor 2352 may be packaged together with computational logic 2383 and configured to practice aspects of various example embodiments described herein to form a System in Package (SiP) or a System on Chip (SoC).

The system 2350 includes processor circuitry in the form of one or more processors 2352. The processor circuitry 2352 includes circuitry such as, but not limited to one or more processor cores and one or more of cache memory, low drop-out voltage regulators (LDOs), interrupt controllers, serial interfaces such as SPI, I2C or universal programmable serial interface circuit, real time clock (RTC), timer-counters including interval and watchdog timers, general purpose I/O, memory card controllers such as secure digital/multi-media card (SD/MMC) or similar, interfaces, mobile industry processor interface (MIPI) interfaces and Joint Test Access Group (JTAG) test access ports. In some implementations, the processor circuitry 2352 may include one or more hardware accelerators (e.g., same or similar to acceleration circuitry 2364), which may be microprocessors, programmable processing devices (e.g., FPGA, ASIC, etc.), or the like. The one or more accelerators may include, for example, computer vision and/or deep learning accelerators. In some implementations, the processor circuitry 2352 may include on-chip memory circuitry, which may include any suitable volatile and/or non-volatile memory, such as DRAM, SRAM, EPROM, EEPROM, Flash memory, solid-state memory, and/or any other type of memory device technology, such as those discussed herein The processor circuitry 2352 may include, for example, one or more processor cores (CPUs), application processors, GPUs, RISC processors, Acorn RISC Machine (ARM) processors, CISC processors, one or more DSPs, one or more FPGAs, one or more PLDs, one or more ASICs, one or more baseband processors, one or more radio-frequency integrated circuits (RFIC), one or more microprocessors or controllers, a multi-core processor, a multithreaded processor, an ultra-low voltage processor, an embedded processor, or any other known processing elements, or any suitable combination thereof. The processors (or cores) 2352 may be coupled with or may include memory/storage and may be configured to execute instructions stored in the memory/storage to enable various applications or operating systems to run on the platform 2350. The processors (or cores) 2352 is configured to operate application software to provide a specific service to a user of the platform 2350. In some embodiments, the processor(s) 2352 may be a special-purpose processor(s)/controller(s) configured (or configurable) to operate according to the various embodiments herein.

As examples, the processor(s) 2352 may include an Intel® Architecture Core™ based processor such as an i3, an i5, an i7, an i9 based processor; an Intel® microcontroller-based processor such as a Quark™, an Atom™, or other MCU-based processor; Pentium® processor(s), Xeon® processor(s), or another such processor available from Intel® Corporation, Santa Clara, California. However, any number other processors may be used, such as one or more of Advanced Micro Devices (AMD) Zen® Architecture such as Ryzen® or EPYC® processor(s), Accelerated Processing Units (APUs), MxGPUs, Epyc® processor(s), or the like; A5-A12 and/or S1-S4 processor(s) from Apple® Inc., Snapdragon™ or Centrig™ processor(s) from Qualcomm® Technologies, Inc., Texas Instruments, Inc.® Open Multimedia Applications Platform (OMAP)™ processor(s); a MIPS-based design from MIPS Technologies, Inc. such as MIPS Warrior M-class, Warrior I-class, and Warrior P-class processors; an ARM-based design licensed from ARM Holdings, Ltd., such as the ARM Cortex-A, Cortex-R, and Cortex-M family of processors; the ThunderX2® provided by Cavium™, Inc.; or the like. In some implementations, the processor(s) 2352 may be a part of a system on a chip (SoC), System-in-Package (SiP), a multi-chip package (MCP), and/or the like, in which the processor(s) 2352 and other components are formed into a single integrated circuit, or a single package, such as the Edison™ or Galileo™ SoC boards from Intel® Corporation. Other examples of the processor(s) 2352 are mentioned elsewhere in the present disclosure.

The system 2350 may include or be coupled to acceleration circuitry 2364, which may be embodied by one or more AI/ML accelerators, a neural compute stick, neuromorphic hardware, an FPGA, an arrangement of GPUs, one or more SoCs (including programmable SoCs), one or more CPUs, one or more digital signal processors, dedicated ASICs (including programmable ASICs), PLDs such as complex (CPLDs) or high complexity PLDs (HCPLDs), and/or other forms of specialized processors or circuitry designed to accomplish one or more specialized tasks. These tasks may include AI/ML processing (e.g., including training, inferencing, and classification operations), visual data processing, network data processing, object detection, rule analysis, or the like. In FPGA-based implementations, the acceleration circuitry 2364 may comprise logic blocks or logic fabric and other interconnected resources that may be programmed (configured) to perform various functions, such as the procedures, methods, functions, etc. of the various embodiments discussed herein. In such implementations, the acceleration circuitry 2364 may also include memory cells (e.g., EPROM, EEPROM, flash memory, static memory (e.g., SRAM, anti-fuses, etc.) used to store logic blocks, logic fabric, data, etc. in LUTs and the like.

In some implementations, the processor circuitry 2352 and/or acceleration circuitry 2364 may include hardware elements specifically tailored for machine learning and/or artificial intelligence (AI) functionality. In these implementations, the processor circuitry 2352 and/or acceleration circuitry 2364 may be, or may include, an AI engine chip that can run many different kinds of AI instruction sets once loaded with the appropriate weightings and training code. Additionally or alternatively, the processor circuitry 2352 and/or acceleration circuitry 2364 may be, or may include, AI accelerator(s), which may be one or more of the aforementioned hardware accelerators designed for hardware acceleration of AI applications. As examples, these processor(s) or accelerators may be a cluster of artificial intelligence (AI) GPUs, tensor processing units (TPUs) developed by Google® Inc., Real AI Processors (RAPs™) provided by AlphaICs®, Nervana™ Neural Network Processors (NNPs) provided by Intel® Corp., Intel® Movidius™ Myriad™ X Vision Processing Unit (VPU), NVIDIA® PX™ based GPUs, the NM500 chip provided by General Vision®, Hardware 3 provided by Tesla®, Inc., an Epiphany™ based processor provided by Adapteva®, or the like. In some embodiments, the processor circuitry 2352 and/or acceleration circuitry 2364 and/or hardware accelerator circuitry may be implemented as AI accelerating co-processor(s), such as the Hexagon 685 DSP provided by Qualcomm®, the PowerVR 2NX Neural Net Accelerator (NNA) provided by Imagination Technologies Limited®, the Neural Engine core within the Apple® A11 or A12 Bionic SoC, the Neural Processing Unit (NPU) within the HiSilicon Kirin 970 provided by Huawei®, and/or the like. In some hardware-based implementations, individual subsystems of system 2350 may be operated by the respective AI accelerating co-processor(s), AI GPUs, TPUs, or hardware accelerators (e.g., FPGAs, ASICs, DSPs, SoCs, etc.), etc., that are configured with appropriate logic blocks, bit stream(s), etc. to perform their respective functions.

The system 2350 also includes system memory 2354. Any number of memory devices may be used to provide for a given amount of system memory. As examples, the memory 2354 may be, or include, volatile memory such as random access memory (RAM), static RAM (SRAM), dynamic RAM (DRAM), synchronous DRAM (SDRAM), RAMBUS® Dynamic Random Access Memory (RDRAM®), and/or any other desired type of volatile memory device. Additionally or alternatively, the memory 2354 may be, or include, non-volatile memory such as read-only memory (ROM), erasable programmable ROM (EPROM), electrically erasable programmable (EEPROM), flash memory, non-volatile RAM, ferroelectric RAM, phase-change memory (PCM), flash memory, and/or any other desired type of non-volatile memory device. Access to the memory 2354 is controlled by a memory controller. The individual memory devices may be of any number of different package types such as single die package (SDP), dual die package (DDP) or quad die package (Q17P). Any number of other memory implementations may be used, such as dual inline memory modules (DIMMs) of different varieties including but not limited to microDIMMs or MiniDIMMs.

Storage circuitry 2358 provides persistent storage of information such as data, applications, operating systems and so forth. In an example, the storage 2358 may be implemented via a solid-state disk drive (SSDD) and/or high-speed electrically erasable memory (commonly referred to as "flash memory"). Other devices that may be used for the storage 2358 include flash memory cards, such as SD cards, microSD cards, XD picture cards, and the like, and USB flash drives. In an example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, phase change RAM (PRAM), resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a Domain Wall (DW) and Spin Orbit Transfer (SOT) based device, a thyristor based memory device, a hard disk drive (HDD), micro HDD, of a combination thereof, and/or any other memory. The memory circuitry 2354 and/or storage circuitry 2358 may also incorporate three-dimensional (3D) cross-point (XPOINT) memories from Intel® and Micron®.

The memory circuitry 2354 and/or storage circuitry 2358 is/are configured to store computational logic 2383 in the form of software, firmware, microcode, or hardware-level instructions to implement the techniques described herein. The computational logic 2383 may be employed to store working copies and/or permanent copies of programming instructions, or data to create the programming instructions, for the operation of various components of system 2300 (e.g., drivers, libraries, application programming interfaces (APIs), etc.), an operating system of system 2300, one or more applications, and/or for carrying out the embodiments discussed herein. The computational logic 2383 may be stored or loaded into memory circuitry 2354 as instructions 2382, or data to create the instructions 2382, which are then accessed for execution by the processor circuitry 2352 to carry out the functions described herein. The processor circuitry 2352 and/or the acceleration circuitry 2364 accesses the memory circuitry 2354 and/or the storage circuitry 2358 over the interconnect (IX) 2356. The instructions 2382 direct the processor circuitry 2352 to perform a specific sequence or flow of actions, for example, as described with respect to flowchart(s) and block diagram(s) of operations and functionality depicted previously. The various elements may be implemented by assembler instructions supported by processor circuitry 2352 or high-level languages that may be compiled into instructions 2381, or data to create the instructions 2381, to be executed by the processor circuitry 2352. The permanent copy of the programming instructions may be placed into persistent storage devices of storage circuitry 2358 in the factory or in the field through, for example, a distribution medium (not shown), through a communication interface (e.g., from a distribution server (not shown)), over-the-air (OTA), or any combination thereof.

The IX 2356 couples the processor 2352 to communication circuitry 2366 for communications with other devices, such as a remote server (not shown) and the like. The communication circuitry 2366 is a hardware element, or collection of hardware elements, used to communicate over one or more networks 2363 and/or with other devices. In one example, communication circuitry 2366 is, or includes, transceiver circuitry configured to enable wireless communications using any number of frequencies and protocols such as, for example, the Institute of Electrical and Electronics Engineers (IEEE) 802.11 (and/or variants thereof), IEEE 802.23.4, Bluetooth® and/or Bluetooth® low energy (BLE), ZigBee®, LoRaWAN™ (Long Range Wide Area Network), a cellular protocol such as 3GPP LTE and/or Fifth Generation (5G)/New Radio (NR), and/or the like. Additionally or alternatively, communication circuitry 2366 is, or includes, one or more network interface controllers (NICs) to enable wired communication using, for example, an Ethernet connection, Controller Area Network (CAN), Local Interconnect Network (LIN), DeviceNet, ControlNet, Data Highway+, or PROFINET, among many others.

The IX 2356 also couples the processor 2352 to interface circuitry 2370 that is used to connect system 2350 with one or more external devices 2372. The external devices 2372 may include, for example, sensors, actuators, positioning circuitry (e.g., global navigation satellite system (GNSS)/Global Positioning System (GPS) circuitry), client devices, servers, network appliances (e.g., switches, hubs, routers, etc.), integrated photonics devices (e.g., optical neural network (ONN) integrated circuit (IC) and/or the like), and/or other like devices.

In some optional examples, various input/output (I/O) devices may be present within or connected to, the system 2350, which are referred to as input circuitry 2386 and output circuitry 2384 in FIG. 23. The input circuitry 2386 and output circuitry 2384 include one or more user interfaces designed to enable user interaction with the platform 2350 and/or peripheral component interfaces designed to enable peripheral component interaction with the platform 2350. Input circuitry 2386 may include any physical or virtual means for accepting an input including, inter alia, one or more physical or virtual buttons (e.g., a reset button), a physical keyboard, keypad, mouse, touchpad, touchscreen, microphones, scanner, headset, and/or the like. The output circuitry 2384 may be included to show information or otherwise convey information, such as sensor readings, actuator position(s), or other like information. Data and/or graphics may be displayed on one or more user interface components of the output circuitry 2384. Output circuitry 2384 may include any number and/or combinations of audio or visual display, including, inter alia, one or more simple visual outputs/indicators (e.g., binary status indicators (e.g., light emitting diodes (LEDs)) and multi-character visual outputs, or more complex outputs such as display devices or touchscreens (e.g., Liquid Crystal Displays (LCD), LED displays, quantum dot displays, projectors, etc.), with the output of characters, graphics, multimedia objects, and the like being generated or produced from the operation of the platform 2350. The output circuitry 2384 may also include speakers and/or other audio emitting devices, printer(s), and/or the like. Additionally or alternatively, sensor(s) may be used as the input circuitry 2384 (e.g., an image capture device, motion capture device, or the like) and one or more actuators may be used as the output device circuitry 2384 (e.g., an actuator to provide haptic feedback or the like). Peripheral component interfaces may include, but are not limited to, a non-volatile memory port, a USB port, an audio jack, a power supply interface, etc. In some embodiments, a display or console hardware, in the context of the present system, may be used to provide output and receive input of an edge computing system; to manage components or services of an edge computing system; identify a state of an edge computing component or service; or to conduct any other number of management or administration functions or service use cases.

The components of the system 2350 may communicate over the IX 2356. The IX 2356 may include any number of technologies, including ISA, extended ISA, I2C, SPI, point-to-point interfaces, power management bus (PMBus), PCI, PCIe, PCIx, Intel® UPI, Intel® Accelerator Link, Intel® CXL, CAPI, OpenCAPI, Intel® QPI, UPI, Intel® OPA IX, RapidIO™ system IXs, CCIX, Gen-Z Consortium IXs, a HyperTransport interconnect, NVLink provided by NVIDIA®, a Time-Trigger Protocol (TTP) system, a FlexRay system, PROFIBUS, and/or any number of other IX technologies. The IX 2356 may be a proprietary bus, for example, used in a SoC based system.

The number, capability, and/or capacity of the elements of system 2300 may vary, depending on whether computing system 2300 is used as a stationary computing device (e.g., a server computer in a data center, a workstation, a desktop computer, etc.) or a mobile computing device (e.g., a smartphone, tablet computing device, laptop computer, game console, IoT device, etc.). In various implementations, the computing device system 2300 may comprise one or more components of a data center, a desktop computer, a workstation, a laptop, a smartphone, a tablet, a digital camera, a smart appliance, a smart home hub, a network appliance, and/or any other device/system that processes data.

The techniques described herein can be performed partially or wholly by software or other instructions provided in a machine-readable storage medium (e.g., memory). The software is stored as processor-executable instructions (e.g., instructions to implement any other processes discussed herein). Instructions associated with the flowchart (and/or various embodiments) and executed to implement embodiments of the disclosed subject matter may be implemented as part of an operating system or a specific application, component, program, object, module, routine, or other sequence of instructions or organization of sequences of instructions.

The storage medium can be a tangible machine readable medium such as read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs)), among others.

The storage medium may be included, e.g., in a communication device, a computing device, a network device, a personal digital assistant, a manufacturing tool, a mobile communication device, a cellular phone, a notebook computer, a tablet, a game console, a set top box, an embedded system, a TV (television), or a personal desktop computer.

Some non-limiting examples of various embodiments are presented below.

Example 1 includes an apparatus, comprising: a sense amplifier comprising a primary output node and a complementary output node, the primary output node coupled to a primary bit line of a first SRAM memory cell and the complementary output node coupled to a complementary bit line of the first SRAM memory cell; a write driver coupled to the sense amplifier; a first write data path coupled from the write driver to the primary bit line; and a second write data path coupled from the write driver to the complementary bit line; wherein the write driver is to pass a bit from the primary output node, a bit from the complementary output node or a bit from write data latch to the first write data path, and to pass an inverse of the bit passed to the first write data path to the second write data path, based on one or more control signals.

Example 2 includes the apparatus of example 1, wherein the write driver comprises a first multiplexer to pass the bit from the primary output node or the bit from the complementary output node to an output node of the first multiplexer based on the one or more control signals, and a second multiplexer to pass the bit from the write data latch or a bit from the output node of the first multiplexer node to an output node of the second multiplexer based on the one or more control signals.

Example 3 includes the apparatus of example 2, wherein the first write data path is coupled to the output node of the second multiplexer, and the second write data path is coupled to the output node of the second multiplexer via an inverter.

Example 4 includes the apparatus of any one of examples 1 to 3, wherein the bit passed to the first write data path is the bit from the complementary output node; and the write driver is to write the bit from the complementary output node to the first SRAM memory cell in a toggle operation.

Example 5 includes the apparatus of any one of examples 1 to 4, wherein the bit passed to the first write data path is the bit from the primary output node; and the write driver is to write the bit from the primary output node to a second SRAM memory cell in a common column with the first SRAM memory cell in a copy operation.

Example 6 includes the apparatus of any one of examples 1 to 5, wherein the bit passed to the first write data path is the bit from the complementary output node; and the write driver is to write the bit from the complementary output node to a second SRAM memory cell in a common column with the first SRAM memory cell in a toggle-copy operation.

Example 7 includes an apparatus comprising: a sense amplifier coupled to a primary bit line and a complementary bit line of first and second data memory cells and a first control memory cell in a common column, wherein first and second data word lines are coupled to the first and second data memory cells, respectively, and a first control word line is coupled to the first control memory cell; and a control circuit coupled to the sense amplifier, the control circuit to perform a logic operation involving bits in the first and second data memory cells, wherein to perform the logic operation, the control circuit is to concurrently activate the first and second data word lines and the first control word line and to receive a bit comprising a result of the logic operation from the sense amplifier.

Example 8 includes the apparatus of example 7, wherein the sense amplifier comprises a primary output node coupled to the primary bit line and a complementary output node coupled to the complementary bit line; and the control circuit is to receive the bit comprising the result of the logic operation from the primary output node of the sense amplifier.

Example 9 includes the apparatus of example 7 or 8, wherein to perform the logic operation, the control circuit is to write a 1 bit to the first control memory cell; and the logic operation comprises an OR of the bits in the first and second data memory cells.

Example 10 includes the apparatus of example 7 or 8, wherein to perform the logic operation, the control circuit is to write a 0 bit to the first control memory cell; and the logic operation comprises an AND of the bits in the first and second data memory cells.

Example 11 includes the apparatus of any one of examples 7 to 10, wherein the sense amplifier is coupled to a third data memory cell and a second control memory cell in the common column; a third data word line is coupled to the third data memory cell; a second control word line is coupled to the second control memory cell; and to perform the logic operation, the control circuit is to concurrently activate the first, second and third data word lines, and the first and second control word lines.

Example 12 includes the apparatus of example 11, wherein to perform the logic operation, the control circuit is to write a 1 bit to the first and second control memory cells; and the logic operation comprises an OR of bits in the first, second and third data memory cells.

Example 13 includes the apparatus of example 11, wherein to perform the logic operation, the control circuit is to write a 1 bit and a 0 bit to the first and second control memory cells, respectively; and the logic operation comprises a majority operation for bits in the first, second and third data memory cells.

Example 14 includes the apparatus of example 11, wherein to perform the logic operation, the control circuit is to write a 0 bit to the first and second control memory cells; and the logic operation comprises an AND of bits in the first, second and third data memory cells.

Example 15 includes the apparatus of any one of examples 11 to 14, wherein the sense amplifier is coupled to a fourth data memory cell and a third control memory cell in the common column; a fourth data word line is coupled to the fourth data memory cell; a third control word line is coupled to the third control memory cell; and to perform the logic operation, the control circuit is to copy a bit from the third data memory cell to the fourth data memory cell, and concurrently activate the first, second, third and fourth data word lines, and the first, second and third control word lines.

Example 16 includes the apparatus of example 15, wherein to perform the logic operation, the control circuit is to write a 1 bit to the first and second control memory cells and a 0 bit to the third control memory cell; and the logic operation comprises (A AND B) OR C, where A and B are bits in the first and second data memory cells, respectively, and C is the bit in the third and fourth data memory cells.

Example 17 includes the apparatus of example 15, wherein to perform the logic operation, the control circuit is to write a 1 bit to the first control memory cell and a 0 bit to the second and third control memory cells; and the logic operation comprises (A OR B) AND C, where A and B are bits in the first and second data memory cells, respectively, C is a bit in the third and fourth data memory cells.

Example 18 includes an apparatus comprising: a memory device to store instructions; and a processor to execute the instructions to perform a logic operation involving bits in first, second and third data memory cells, wherein: the first, second and third data memory cells are in a common column with first and second control memory cells; first, second and third data word lines are coupled to the first, second and third data memory cells, respectively; first and second control word lines are coupled to the first and second control memory cells, respectively; and to perform the logic operation, the processor is to write data to the first and second control memory cells based on the logic operation, concurrently activate the first, second and third data word lines and the first and second control word lines, and receive a bit comprising a result of the logic operation from the sense amplifier.

Example 19 includes the apparatus of example 18, wherein the common column comprises a primary bit line and a complementary bit line; the sense amplifier comprises a primary output node coupled to the primary bit line and a complementary output node coupled to the complementary bit line; to perform the logic operation, the processor is to write a 1 bit to the first and second control memory cells; the logic operation comprises A OR B OR C, where A, B and C are bits in the first, second and third data memory cells, respectively; and the bit comprising the result of the logic operation is received from the primary output node of the sense amplifier.

Example 20 includes the apparatus of example 18, wherein the common column comprises a primary bit line and a complementary bit line; the sense amplifier comprises a primary output node coupled to the primary bit line and a complementary output node coupled to the complementary bit line; and to perform the logic operation, the processor is to write a 1 bit to the first control memory cell and a 0 bit to the second control memory cell; the logic operation comprises a majority operation for bits in the first, second and third data memory cells; and the bit comprising the result of the logic operation is received from the primary output node of the sense amplifier.

Example 21 includes the apparatus of example 18, wherein the common column comprises a primary bit line and a complementary bit line; the sense amplifier comprises a primary output node coupled to the primary bit line and a complementary output node coupled to the complementary bit line; and to perform the logic operation, the processor is to write a 0 bit to the first and second control memory cells; the logic operation comprises A AND B AND C, where A, B and C are bits in the first, second and third data memory cells; and the bit comprising the result of the logic operation is received from the primary output node of the sense amplifier.

Example 22 includes the apparatus of any one of examples 18 to 21, wherein the common column comprises a primary bit line and a complementary bit line; the sense amplifier comprises a primary output node coupled to the primary bit line and a complementary output node coupled to the complementary bit line; and the bit comprising the result of the logic operation is received from the primary output node of the sense amplifier.

Example 23 includes the apparatus of any one of examples 18 to 22, wherein the common column comprises a primary bit line and a complementary bit line; the sense amplifier comprises a primary output node coupled to the primary bit line and a complementary output node coupled to the complementary bit line; and the bit comprising the result of the logic operation is received from the complementary output node of the sense amplifier.

Example 24 includes the apparatus of example 23, wherein a fourth data memory cell and a third control memory cell are in the common column; a fourth data word line and a third control word line are coupled to the fourth data memory cell and the third control memory cell, respectively; and to perform the logic operation, the processor is to copy a bit from the third data memory cell to the fourth data memory cell, and concurrently activate the first, second, third and fourth data word lines, and the first, second and third control word lines.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:

a sense amplifier coupled to a primary bit line and a complementary bit line of first and second data memory cells and a first control memory cell in a common column, wherein first and second data word lines are coupled to the first and second data memory cells, respectively, and a first control word line is coupled to the first control memory cell; and a control circuit coupled to the sense amplifier, the control circuit to perform a logic operation involving bits in the first and second data memory cells, wherein to perform the logic operation, the control circuit is to concurrently activate the first and second data word lines and the first control word line and to receive a bit comprising a result of the logic operation from the sense amplifier, wherein the result corresponds to a majority value resolved by the sense amplifier for the first, second, and control memory cells.

2. The apparatus of claim 1, wherein:

the sense amplifier comprises a primary output node coupled to the primary bit line and a complementary output node coupled to the complementary bit line; and the control circuit is to receive the bit comprising the result of the logic operation from the primary output node of the sense amplifier.

3. The apparatus of claim 1, wherein:

to perform the logic operation, the control circuit is to write a 1 bit to the first control memory cell; and the logic operation comprises an OR of the bits in the first and second data memory cells.

4. The apparatus of claim 1, wherein:

to perform the logic operation, the control circuit is to write a 0 bit to the first control memory cell; and the logic operation comprises an AND of the bits in the first and second data memory cells.

5. The apparatus of claim 1, wherein:

the sense amplifier is coupled to a third data memory cell and a second control memory cell in the common column;

a third data word line is coupled to the third data memory cell;

a second control word line is coupled to the second control memory cell; and to perform the logic operation, the control circuit is to concurrently activate the first, second and third data word lines, and the first and second control word lines.

6. The apparatus of claim 5, wherein:

to perform the logic operation, the control circuit is to write a 1 bit to the first and second control memory cells; and the logic operation comprises an OR of bits in the first, second and third data memory cells.

7. The apparatus of claim 5, wherein:

to perform the logic operation, the control circuit is to write a 1 bit and a 0 bit to the first and second control memory cells, respectively; and the logic operation comprises a majority operation for bits in the first, second and third data memory cells.

8. The apparatus of claim 5, wherein:

to perform the logic operation, the control circuit is to write a 0 bit to the first and second control memory cells; and the logic operation comprises an AND of bits in the first, second and third data memory cells.

9. The apparatus of claim 5, wherein:

the sense amplifier is coupled to a fourth data memory cell and a third control memory cell in the common column;

a fourth data word line is coupled to the fourth data memory cell;

a third control word line is coupled to the third control memory cell; and to perform the logic operation, the control circuit is to copy a bit from the third data memory cell to the fourth data memory cell, and concurrently activate the first, second, third and fourth data word lines, and the first, second and third control word lines.

10. The apparatus of claim 9, wherein:

to perform the logic operation, the control circuit is to write a 1 bit to the first and second control memory cells and a 0 bit to the third control memory cell; and the logic operation comprises (A AND B) OR C, where A and B are bits in the first and second data memory cells, respectively, and C is the bit in the third and fourth data memory cells.

11. The apparatus of claim 9, wherein:

to perform the logic operation, the control circuit is to write a 1 bit to the first control memory cell and a 0 bit to the second and third control memory cells; and the logic operation comprises (A OR B) AND C, where A and B are bits in the first and second data memory cells, respectively, C is a bit in the third and fourth data memory cells.

12. An apparatus, comprising:

a memory device to store instructions; and a processor to execute the instructions to perform a logic operation involving bits in first, second and third data memory cells, wherein:

the first, second and third data memory cells are in a common column with first and second control memory cells;

first, second and third data word lines are coupled to the first, second and third data memory cells, respectively;

first and second control word lines are coupled to the first and second control memory cells, respectively; and to perform the logic operation, the processor is to write data to the first and second control memory cells based on the logic operation, concurrently activate the first, second and third data word lines and the first and second control word lines, and receive a bit comprising a result of the logic operation from a sense amplifier, wherein the result corresponds to a majority value resolved by the sense amplifier for the first, second, third, first control, and second control memory cells.

13. The apparatus of claim 12, wherein:

the common column comprises a primary bit line and a complementary bit line;

the sense amplifier comprises a primary output node coupled to the primary bit line and a complementary output node coupled to the complementary bit line;

to perform the logic operation, the processor is to write a 1 bit to the first and second control memory cells;

the logic operation comprises A OR B OR C, where A, B and C are bits in the first, second and third data memory cells, respectively; and the bit comprising the result of the logic operation is received from the primary output node of the sense amplifier.

14. The apparatus of claim 12, wherein:

the common column comprises a primary bit line and a complementary bit line;

the sense amplifier comprises a primary output node coupled to the primary bit line and a complementary output node coupled to the complementary bit line;

to perform the logic operation, the processor is to write a 1 bit to the first control memory cell and a 0 bit to the second control memory cell;

the logic operation comprises a majority operation for bits in the first, second and third data memory cells; and the bit comprising the result of the logic operation is received from the primary output node of the sense amplifier.

15. The apparatus of claim 12, wherein:

the common column comprises a primary bit line and a complementary bit line;

the sense amplifier comprises a primary output node coupled to the primary bit line and a complementary output node coupled to the complementary bit line;

to perform the logic operation, the processor is to write a 0 bit to the first and second control memory cells;

the logic operation comprises A AND B AND C, where A, B and C are bits in the first, second and third data memory cells; and the bit comprising the result of the logic operation is received from the primary output node of the sense amplifier.

16. The apparatus of claim 12, wherein:

the common column comprises a primary bit line and a complementary bit line;

the sense amplifier comprises a primary output node coupled to the primary bit line and a complementary output node coupled to the complementary bit line; and the bit comprising the result of the logic operation is received from the primary output node of the sense amplifier.

17. The apparatus of claim 12, wherein:

the common column comprises a primary bit line and a complementary bit line;

the sense amplifier comprises a primary output node coupled to the primary bit line and a complementary output node coupled to the complementary bit line; and the bit comprising the result of the logic operation is received from the complementary output node of the sense amplifier.

18. The apparatus of claim 17, wherein:

a fourth data memory cell and a third control memory cell are in the common column;

a fourth data word line and a third control word line are coupled to the fourth data memory cell and the third control memory cell, respectively; and to perform the logic operation, the processor is to copy a bit from the third data memory cell to the fourth data memory cell, and concurrently activate the first, second, third and fourth data word lines, and the first, second and third control word lines.

* * * * *